(12) United States Patent
Shibazaki

(10) Patent No.: US 8,797,508 B2
(45) Date of Patent: Aug. 5, 2014

(54) EXPOSURE APPARATUS, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 574 days.

(21) Appl. No.: 12/265,831

(22) Filed: Nov. 6, 2008

(65) Prior Publication Data
US 2009/0225288 A1 Sep. 10, 2009

Related U.S. Application Data

(60) Provisional application No. 60/996,798, filed on Dec. 5, 2007.

(30) Foreign Application Priority Data

Nov. 7, 2007 (JP) ................................. 2007-289203

(51) Int. Cl.
*G03B 27/58* (2006.01)
*G03F 7/20* (2006.01)

(52) U.S. Cl.
CPC ........ *G03F 7/70775* (2013.01); *G03F 7/70341* (2013.01); *G03F 7/70733* (2013.01)
USPC ................................. 355/72; 355/30; 355/77

(58) Field of Classification Search
CPC ............ G03F 7/70341; G03F 7/70716; G03F 7/70775; G03F 7/70758; G03F 7/70733
USPC .......................................... 355/30, 53, 72, 77
See application file for complete search history.

(56) References Cited

U.S. PATENT DOCUMENTS

| 4,780,617 A | 10/1988 | Umatate et al. |
| 5,448,332 A | 9/1995 | Sakakibara et al. |
| 6,208,407 B1 | 3/2001 | Loopstra |

(Continued)

FOREIGN PATENT DOCUMENTS

| EP | 1 420 298 A2 | 5/2004 |
| EP | 1713113 A1 * | 10/2006 |

(Continued)

OTHER PUBLICATIONS

Written Opinion of the International Searching Authority dated Dec. 2, 2008 in International Patent Application No. PCT/JP2008/003160 (with translation).

(Continued)

*Primary Examiner* — Steven H Whitesell Gordon
(74) *Attorney, Agent, or Firm* — Oliff PLC

(57) ABSTRACT

During the transition from a state where one of wafer stages is located in an area below a projection optical system where a liquid immersion area is formed to a state where the other of the wafer stages is located in the area, both the wafer stages are made to be in proximity or in contact in a Y-axis direction in a state of being shifted in an X-axis direction, by making an overhang section and a stepped section that are arranged respectively on the wafer stages be engaged, and both the wafer stages are simultaneously driven in the Y-axis direction while maintaining this state. Accordingly, the liquid immersion area is delivered between the two wafer stages via the overhang section and leakage of a liquid that forms the liquid immersion area is restrained.

66 Claims, 14 Drawing Sheets

(56) References Cited

U.S. PATENT DOCUMENTS

| | | |
|---|---|---|
| 6,611,316 B2 | 8/2003 | Sewell |
| 6,778,257 B2 | 8/2004 | Bleeker et al. |
| 6,879,377 B2 * | 4/2005 | Jacobs et al. ............... 355/53 |
| 6,952,253 B2 | 10/2005 | Lof et al. |
| 7,023,610 B2 | 4/2006 | Ohtsuki et al. |
| 7,158,232 B2 * | 1/2007 | Akutsu et al. ............ 356/400 |
| 7,161,659 B2 | 1/2007 | Van Den Brink et al. |
| 7,307,692 B2 | 12/2007 | Korenaga et al. |
| 7,310,132 B2 * | 12/2007 | Van Der Schoot et al. ..... 355/72 |
| 7,456,929 B2 | 11/2008 | Shibuta |
| 7,483,120 B2 * | 1/2009 | Luttikhuis et al. ........... 355/53 |
| 2003/0025890 A1 | 2/2003 | Nishinaga |
| 2005/0248856 A1 | 11/2005 | Omura et al. |
| 2005/0280791 A1 | 12/2005 | Nagasaka et al. |
| 2006/0092399 A1 * | 5/2006 | Ockwell ...................... 355/72 |
| 2006/0114445 A1 | 6/2006 | Ebihara |
| 2006/0227308 A1 | 10/2006 | Brink et al. |
| 2006/0227309 A1 | 10/2006 | Loopstra et al. |
| 2006/0231206 A1 | 10/2006 | Nagasaka et al. |
| 2007/0127006 A1 | 6/2007 | Shibazaki |
| 2008/0088843 A1 | 4/2008 | Shibazaki |
| 2008/0111979 A1 * | 5/2008 | Emoto ........................ 355/30 |
| 2008/0117398 A1 * | 5/2008 | Emoto ........................ 355/53 |
| 2008/0137045 A1 * | 6/2008 | Kiuchi ........................ 355/30 |
| 2008/0158531 A1 | 7/2008 | Kiuchi |
| 2008/0239256 A1 | 10/2008 | Nagasaka |
| 2009/0207391 A1 * | 8/2009 | Hayashi ..................... 355/30 |
| 2009/0208885 A1 | 8/2009 | Kiuchi |

FOREIGN PATENT DOCUMENTS

| | | |
|---|---|---|
| EP | 1 918 983 A1 | 5/2008 |
| JP | A-2006-332656 | 12/2006 |
| JP | A-2007-281308 | 10/2007 |
| JP | A-2008-124219 | 5/2008 |
| JP | A-2008-130745 | 6/2008 |
| WO | WO 2004/090577 A2 | 10/2004 |
| WO | WO 2005/059617 A2 | 6/2005 |
| WO | WO 2005/059618 A2 | 6/2005 |
| WO | WO 2007/018127 A1 | 2/2007 |
| WO | WO 2007/055237 A1 | 5/2007 |
| WO | WO 2007/097379 A1 | 8/2007 |
| WO | WO 2008044612 A1 * | 4/2008 |

OTHER PUBLICATIONS

Office Action mailed on Dec. 14, 2011 in corresponding Japanese Patent Application No. 2009-539947. (with English language translation).

* cited by examiner

EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 60/996,798 filed Dec. 5, 2007, the disclosure of which is hereby incorporated herein by reference in its entirety.

BACKGROUND OF THE INVENTION

1. Field of the Invention

The present invention relates to exposure apparatuses, exposure methods and device manufacturing methods, and more particularly, to an exposure apparatus and an exposure method used in a lithography process for manufacturing microdevices such as semiconductor devices, and a device manufacturing method using the exposure method.

2. Description of the Background Art

Conventionally, in a lithography process for manufacturing electron devices (microdevices) such as semiconductor devices (such as integrated circuits) and liquid crystal display devices, an exposure apparatus such as a projection exposure apparatus by a step-and-repeat method (a so-called stepper), or a projection exposure apparatus by a step-and-scan method (a so-called scanning stepper (which is also called a scanner)) is mainly used.

In this type of the exposure apparatus, in order to improve the resolution of a projection optical system, the wavelength of exposure light has been shortened and the numerical aperture of the projection optical system has been increased (increased NA). However, due to the shortened wavelength of exposure light and the increased NA of the projection optical system, a depth of focus has been narrowed. Therefore, as a method to substantially shorten the exposure wavelength, and also increase (widen) a depth of focus compared with in the air, an exposure apparatus making use of a liquid immersion method has been recently gathering attention.

Meanwhile, as well as the high resolution, high throughput is also required for an exposure apparatus. As a method to improve the throughput, various types of a twin-wafer-stage type exposure apparatus are proposed that employ a method in which a plurality of wafer stages to hold a wafer, e.g., two wafer stages are provided, and different operations are concurrently processed on the two wafer stages.

Moreover, recently, a twin-wafer-stage type exposure apparatus that employs a liquid immersion exposure method has been also proposed (e.g., refer to U.S. Pat. No. 7,161,659).

In the meantime, in the case of measuring the position (height) of a wafer stage in a Z-axis direction that is orthogonal to an XY plane, a Z interferometer is known that measures the height of the wafer stage by irradiating a measurement beam parallel to the XY plane to a reflection surface (a reflection surface for Z measurement) that is placed on a side surface of the wafer stage so as to be inclined at a predetermined angle, e.g., an angle of 45 degrees with respect to the XY plane, and receiving a return light of the beam (e.g., refer to U.S. Pat. No. 6,208,407).

However, in the case where the above-described Z interferometer is employed in an exposure apparatus of a similar type to the exposure apparatus disclosed in U.S. Pat. No. 7,161,659, a configuration is desired in which height measurement of both the wafer stages can be performed with the Z interferometers on both sides. With such a configuration, however, when the two stages were made to be in contact or in proximity and a liquid immersion area (a liquid) was delivered between both the wafer stages as is disclosed in U.S. Pat. No. 6,208,407, there was a possibility that the reflection surfaces for Z measurement came into contact with each other and had damages. Further, in order to prevent such a situation from arising, when trying to perform the delivery of the liquid immersion area in a state where the two wafer stages were apart from each other, there was a possibility that the liquid leaked to between both the wafer stages and the delivery of the liquid immersion area could not be performed. In addition, the leaked liquid could wet the reflection surfaces for Z measurement. Further, even if the reflection surfaces for Z measurement are not used, in the cases such as where at least one of the wafer stages has a mechanism section that protrudes beyond other sections, the problem similar to the above-described one could occur when the liquid immersion area (the liquid) is delivered between the two wafer stages with both the wafer stages being in contact or in proximity.

SUMMARY OF THE INVENTION

According to a first aspect of the present invention, there is provided an exposure apparatus that exposes an object with an energy beam via an optical system and a liquid, the apparatus comprising: a first movable body on which the object can be mounted, and which can move substantially along a predetermined plane within an area of a predetermined range that includes a first area including a liquid immersion area directly under the optical system where the liquid is supplied and a second area located on one side of the first area in a first direction where positional information of the object is acquired; a second movable body on which the object can be mounted, and which can move independently from the first movable body substantially along the predetermined plane within an area including the first area and the second area; a movable body drive system that drives the first and second movable bodies substantially along the predetermined plane, and during transition from a first state where one of the movable bodies is located in the first area to a second state where the other of the movable bodies is located in the first area, drives the first and second movable bodies simultaneously in the first direction while maintaining a scrum state where the first movable body and the second movable body are shifted in a second direction that is perpendicular to the first direction within the predetermined plane and are in proximity or in contact via respective parts of their facing surfaces in the first direction.

With this apparatus, by moving the first and second movable bodies in the first direction while maintaining the scrum state of the first and second movable bodies, the liquid immersion area can be delivered between both the movable bodies without leaking the liquid from between both the movable bodies. Accordingly, operations such as full recovery and re-supply of the liquid of the liquid immersion area become unnecessary. Further, compared with the case where the first and second movable bodies are made to approach or come into contact in the second direction, a movement distance (a movement stroke) of both the movable bodies can be shortened. Further, by making both the movable bodies be in proximity or in contact via respective parts of their facing surfaces in the first direction in a state of being shifted in the second direction, the movement stroke of both the movable bodies can be further shortened. Consequently, the throughput can be improved.

According to a second aspect of the present invention, there is provided an exposure method of exposing an object with an energy beam via an optical system and a liquid, the method comprising: by driving a first movable body and a second movable body, on each of which the object can be mounted and which can move independently from each other substantially along a predetermined plane within an area of a predetermined range that includes a first area including a liquid immersion area directly under the optical system where the liquid is supplied and a second area located on one side of the first area in a first direction where positional information of the object is acquired, simultaneously in the first direction while maintaining a scrum state where the first movable body and the second movable body are shifted in a second direction that is perpendicular to the first direction within the predetermined plane and are in proximity or in contact in the first direction, delivering the liquid immersion area from one of the movable bodies to the other of the movable bodies and making transition from a first state where one of the movable bodies is located in the first area to a second state where the other of the movable bodies is located in the first area.

With this method, during the transition from the first state where one of the movable bodies is located in the first area to the second state where the other of the movable bodies is located in the first area, the first movable body and the second movable body are simultaneously driven in the first direction while keeping the scrum state where the first and second movable bodies are shifted in the second direction and are in proximity or in contact in the first direction, and the liquid immersion area is delivered from one of the movable bodies to the other of the movable bodies. Accordingly, it becomes possible to deliver the liquid immersion area between both the movable bodies without leaking the liquid from between both the movable bodies. Consequently, operations such as full recovery and re-supply of the liquid of the liquid immersion area become unnecessary. Further, compared with the case where the first and second movable bodies are made to approach or come into contact in the second direction, a movement distance (a movement stroke) of both the movable bodies, which is required when moving the movable bodies into the scrum state, can be shortened. Further, by making both the movable bodies be in proximity or in contact in the first direction in a state of being shifted in the second direction, the movement stroke of both the movable bodies can be further shortened. Therefore, the throughput can be improved.

According to a third aspect of the present invention, there is provided a device manufacturing method, including; a lithography process in which the object is exposed in the exposure method of the present invention.

BRIEF DESCRIPTION OF THE DRAWINGS

In the accompanying drawings;

FIG. 4 is a plan view showing a placement of an interferometer system which the exposure apparatus shown in FIG. 1 is equipped with;

DESCRIPTION OF THE EMBODIMENTS

An embodiment of the present invention is described below, with reference to FIGS. 1 to 12.

Figure 1:
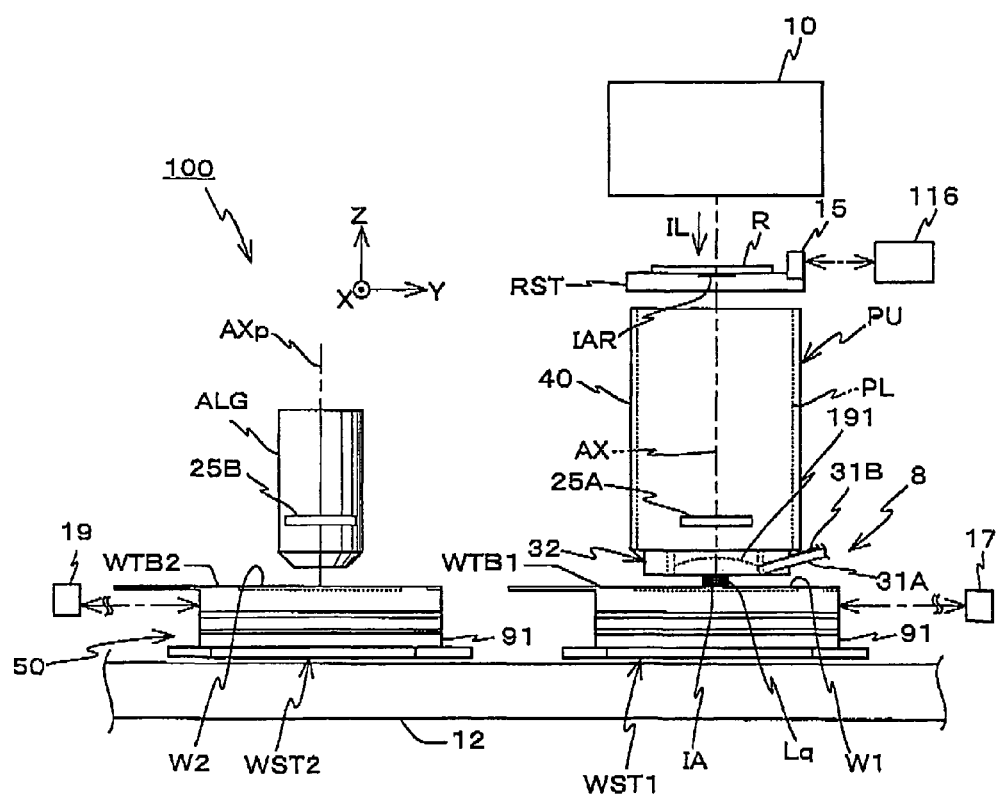
FIG. 1 is a view schematically showing a configuration of an exposure apparatus of an embodiment.

FIG. 1 schematically shows a configuration of a twin-stage-type exposure apparatus 100 related to the embodiment. Exposure apparatus 100 is a projection exposure apparatus by a step-and-scan method, which is a so-called scanner. As is described later on, in the embodiment, a projection optical system PL and an alignment system ALG are arranged, and the following explanation will be given assuming that a direction parallel to an optical axis AX of projection optical system PL is a Z-axis direction, a direction parallel to a straight line that connects the center (optical axis AX) of projection optical system PL and the detection center (an optical axis AXp) of alignment system ALG within a plane orthogonal to the Z-axis direction is a Y-axis direction, a direction orthogonal to a Z-axis and a Y-axis is an X-axis direction, and rotation (inclination) directions about the X-axis, the Y-axis and the Z-axis are θx, θy and θz directions, respectively.

Exposure apparatus 100 is equipped with an illumination system 10, a reticle stage RST, a projection unit PU, a local liquid immersion device 8, alignment system ALG, a stage device 50, their control system, and the like. Incidentally, in FIG. 1, two wafer stages WST1 and WST2, which constitute stage device 50, are located below projection unit PU and alignment system ALG, respectively. Further, on wafer stages WST1 and WST2, wafers W1 and W2 are mounted respectively.

Illumination system 10 has: a light source; and an illumination optical system that includes an illuminance uniformity optical system containing an optical integrator and the like, and a reticle blind and the like (none of which are shown), as is disclosed in, for example, U.S. Pat. Application Publication No. 2003/0025890 and the like. Illumination system 10 illuminates a slit-shaped illumination area IAR that is defined by the reticle blind (which is also called the masking system) on reticle R with an illumination light (exposure light) IL with substantially uniform illuminance. In this case, as illumination light IL, an ArF excimer laser light (wavelength: 193 nm) is used, for example.

On reticle stage RST, reticle R having a pattern surface (the lower surface in FIG. 1) on which a circuit pattern and the like are formed is fixed by, for example, vacuum suction. Reticle stage RST is finely drivable within an XY plane and also drivable at a predetermined scanning speed in a scanning direction (which is the Y-axis direction being a lateral direction of the page surface of FIG. 1, in this case), with a reticle stage drive system 11 (not shown in FIG. 1, refer to FIG. 6) including, for example, a linear motor or the like.

Positional information (including rotational information in the θz direction) within the XY plane (movement plane) of reticle stage RST is constantly detected at a resolution of, for example, around 0.25 nm with a reticle laser interferometer (hereinafter, referred to as a "reticle interferometer") 116 via a movable mirror 15 (in actuality, a Y movable mirror (or a retroreflector) having a reflection surface orthogonal to the Y-axis direction and an X movable mirror having a reflection surface orthogonal to the X-axis direction are arranged). The positional information from reticle interferometer 116 is sent to a main controller 20 (not shown in FIG. 1, refer to FIG. 6). Based on the positional information that has been sent, main controller 20 controls the position (and the velocity) of reticle stage RST via reticle stage drive system 11.

Projection unit PU is placed below (in a −Z direction) reticle stage RST in FIG. 1. Projection unit PU includes a barrel 40 and projection optical system PL held within barrel 40. As projection optical system PL, for example, a dioptric system that is composed of a plurality of optical elements (lens elements) that are disposed along optical axis AX parallel to the Z-axis direction is used. Projection optical system PL is, for example, both-side telecentric and has a predetermined projection magnification (e.g. one-quarter, one-fifth, one-eighth times, or the like). Therefore, when illumination area IAR on reticle R is illuminated with illumination light IL from illumination system 10, illumination light IL having passed through reticle R whose pattern surface is placed substantially coincident with a first plane (an object plane) of projection optical system PL forms a reduced image of a circuit pattern (a reduced image of a part of a circuit pattern) of reticle R within illumination area IAR on an area (hereinafter, also referred to as an "exposure area") IA that is conjugate to illumination area IAR on wafer W1 (or W2), which is placed on the second plane (the image plane) side of projection optical system PL and whose surface is coated with a resist (a sensitive agent), via projection optical system PL (projection unit PU). Then, by moving reticle R in the scanning direction (the Y-axis direction) relative to illumination area IAR (illumination light IL) and also moving wafer W1 (or W2) in the scanning direction (the Y-axis direction) relative to exposure area IA (illumination light IL) by synchronous drive of reticle stage RST and wafer stage WST1 (or WST2), scanning exposure of one shot area (divided area) on wafer W1 (or W2) is performed, and a pattern of reticle R is transferred to the shot area. More specifically, in the embodiment, a pattern is generated on wafer W1 (or W2) by illumination system 10, reticle R and projection optical system PL, and the pattern is formed on wafer W1 (or W2) by exposure of a sensitive layer (a resist layer) on wafer W1 (or W2) with illumination light IL.

In exposure apparatus 100 of the embodiment, local liquid immersion device 8 is arranged to perform exposure in a liquid immersion method. Local liquid immersion device 8 includes a liquid supply device 5, a liquid recovery device 6 (none of which are shown in FIG. 1, refer to FIG. 6), a liquid supply pipe 31A, a liquid recovery pipe 31B, a nozzle unit 32 and the like. As shown in FIG. 1, nozzle unit 32 is supported in a suspended manner by a main frame (not shown) that holds projection unit PU so as to enclose the periphery of a lower end of barrel 40 that holds an optical element that is closest to the image plane side (the wafer side) constituting projection optical system PL, which is a lens (hereinafter, also referred to a "tip lens") 191 in this case. In the embodiment, as shown in FIG. 1, the lower end surface of nozzle unit 32 is set substantially flush with the lower end surface of tip lens 191.

Figure 6:
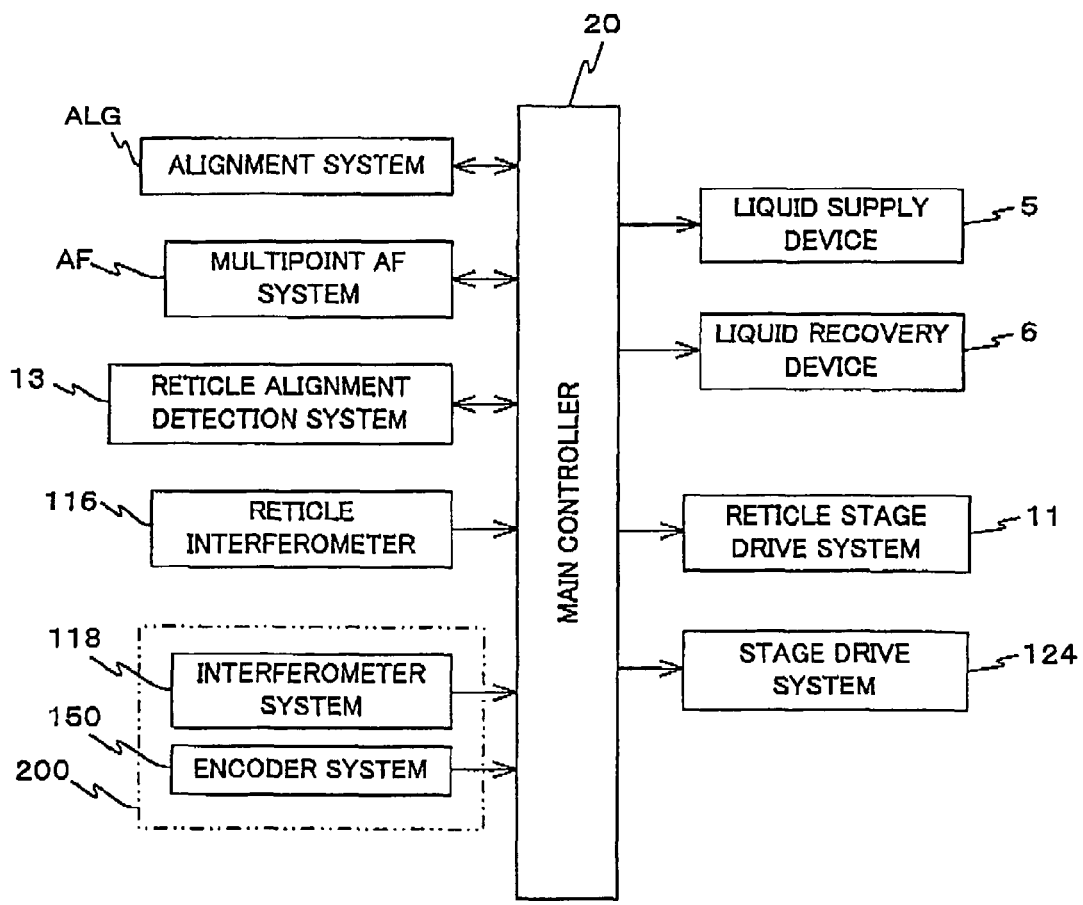
FIG. 6 is a block diagram showing a main configuration of a control system of the exposure apparatus of the embodiment.

Liquid supply pipe 31A is connected to liquid supply device 5 (not shown in FIG. 1, refer to FIG. 6), and liquid recovery pipe 31B is connected to liquid recovery device 6 (not shown in FIG. 1, refer to FIG. 6). In this case, liquid supply device 5 is equipped with a tank to store a liquid, a compression pump, a temperature controller, a valve used to control a flow rate of a liquid, and the like. Liquid recovery device 6 is equipped with a tank to store a recovered liquid, a suction pump, a valve used to control a flow rate of a liquid, and the like.

Main controller 20 controls liquid supply device 5 (refer to FIG. 6) to supply a liquid Lq to a space between tip lens 191 and wafer W1 (or W2) via liquid supply pipe 31A, and controls liquid recovery device 6 (refer to FIG. 6) to recover liquid Lq from the space between tip lens 191 and wafer W1 (or W2) via liquid recovery pipe 31B. On this operation, main controller 20 controls liquid supply device 5 and liquid recovery device 6 so that a quantity of the supplied liquid and a quantity of the recovered liquid constantly equal. Accordingly, in the space between tip lens 191 and wafer W1 (or W2), a constant quantity of liquid Lq is held by being constantly replaced, which forms a liquid immersion area 14 (refer to the drawings such as FIG. 4). In exposure apparatus 100 of the embodiment, by irradiating wafer W1 (or W2) with illumination light IL via liquid Lq that forms liquid immersion area 14, exposure to wafer W1 (or W2) is performed. In this case, liquid immersion area 14 is a three-dimensional space filled with liquid Lq that should be also called a liquid immersion space, but a space also means a gap, and therefore a term "a liquid immersion area" is used in this specification in order to avoid such misunderstanding.

As the liquid described above, for example, pure water which ArF excimer laser light (a light with a wavelength of 193 nm) is transmitted through is used. Incidentally, a refractive index n of the pure water with respect to the ArF excimer laser light is around 1.44, and in the pure water, the wavelength of illumination light IL is 193 nm×1/n, shortened to around 134 nm.

Alignment system ALG is placed at a position that is a predetermined distance apart from the center of projection unit PU (optical axis AX of projection optical system PL (which coincides with the center of exposure area IA described previously, in the embodiment)) on the −Y side, and is fixed to the main frame (not shown). In this case, as alignment system ALG, for example, an FIA (Field Image Alignment) system by an image processing method is used. When performing wafer alignment and the like, alignment system ALG images fiducial marks on wafer stage WST1 or WST2, or alignment marks on a wafer (wafer marks) in response to instructions of main controller 20, and supplies the imaging signals to main controller 20 via a signal processing system (not shown) (refer to FIG. 6).

In addition, in exposure apparatus 100 of the embodiment, a multipoint focal position detecting system (hereinafter, shortly referred to as a multipoint AF system) AF (not shown in FIG. 1, refer to FIG. 6) by an oblique incident method, which has a configuration similar to the one disclosed in, for example, U.S. Pat. No. 5,448,332 and the like, is arranged close to projection unit PU. In this case, as multipoint AF system AF, the system is used that has a configuration in which a detection beam from an irradiation system is irradiated to each of a plurality of detection points on the surface of wafer W1 (or W2) via a light-transmitting section (not shown) formed at nozzle unit 32 described previously and liquid Lq in the liquid immersion area, and a photodetection system receives a reflected light of the detection beam reflected off each of the plurality of detection points via another light-transmitting section formed at nozzle unit 32. Detection signals of multipoint AF system AF are supplied to main controller 20 via an AF signal processing system (not shown) (refer to FIG. 6). Based on the detection signals of the multipoint AF system, main controller 20 detects positional information of the wafer W surface in the Z-axis direction at each of the detection points, and based on the detection results, executes so-called focus-leveling control of wafer W during scanning exposure. Incidentally, it is also possible that the multipoint AF system is arranged close to alignment detection system ALG, surface position information (unevenness information) of the wafer surface is acquired in advance during wafer alignment, and then, during exposure, the so-called focus-leveling control of wafer W is executed using the surface position information and the measurement values of another sensor that detects the position of the wafer stage upper surface in the Z-axis direction.

Furthermore, in exposure apparatus 100, a reticle alignment detection system 13 (not shown in FIG. 1, refer to FIG. 6) composed of a pair of TTR (Through The Reticle) alignment systems using light with an exposure wavelength is arranged above reticle stage RST. Detection signals of reticle alignment detection system 13 are supplied to main controller 20 via an alignment signal processing system (not shown) (refer to FIG. 6).

As shown in FIG. 1, stage device 50 is equipped with wafer stages WST1 and WST2 placed above a base board 12, a measurement system 200 (refer to FIG. 6) including an interferometer system 118 that measures positional information of wafer stages WST1 and WST2, a stage drive system 124 (refer to FIG. 6) that drives wafer stages WST1 and WST2, and the like. Wafer stages WST1 and WST2 are supported by levitation above base board 12 via a clearance of around several μm, by an air slider (to be described later) which wafer stages WST1 and WST2 are respectively equipped with. And, wafer stages WST1 and WST2 are each drivable within the XY plane along the upper surface (movement guide plane) of base board 12, with a planar motor (to be described later) that constitutes stage drive system 124.

Figure 2A:
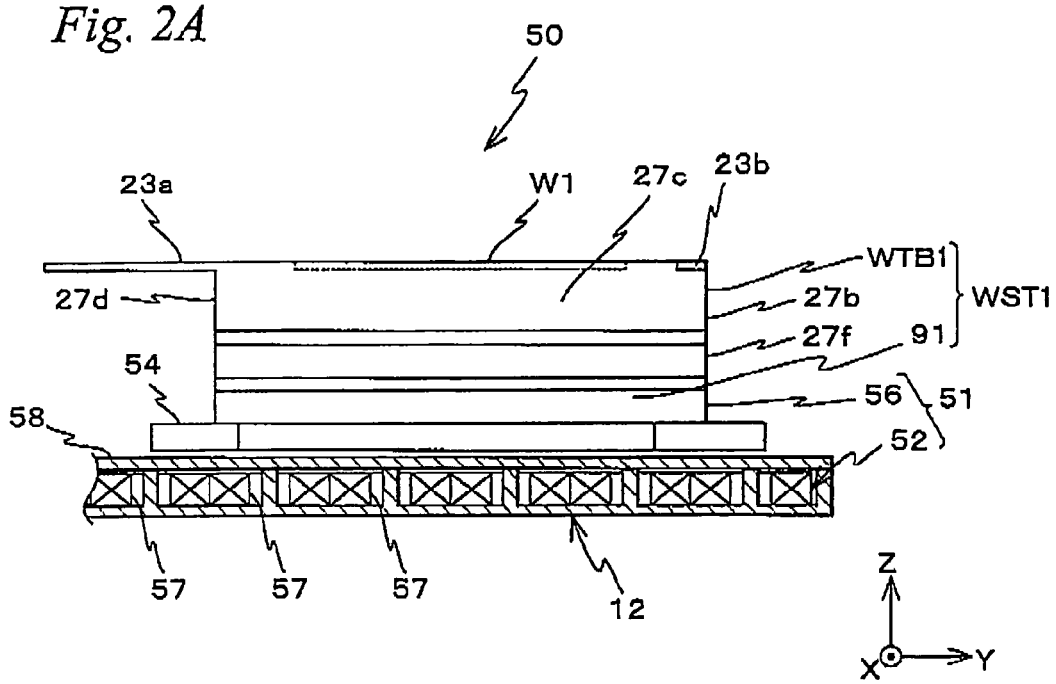
FIG. 2A is a front view showing a wafer stage WST1 shown in FIG. 1.

As shown in FIGS. 1 and 2A, wafer stage WST1 includes a stage main body 91, and a wafer table WTB1 mounted on stage main body 91. As shown in FIG. 2A, stage main body 91 has a mover 56 that constitutes a planar motor 51 together with a stator 52 embedded inside based board 12, and an air slider 54 that is integrally arranged on the periphery of a lower half of mover 56 and has a plurality of air bearings.

Mover 56 is configured of a magnetic unit including a tabular magnetism generating body which is made up of a plurality of flat plate magnets disposed in a matrix shape, for example, so that polarities of adjacent pole faces are different from each other.

Meanwhile, stator 52 is composed of an armature unit having a plurality of armature coils (drive coils) 57 disposed in a matrix shape inside base board 12. As armature coils 57, X drive coils and Y drive coils are arranged in the embodiment. Then, stator 52 made up of the armature unit including a plurality of the X drive coils and the Y drive coils and mover 56 made up of the foregoing magnetic unit constitute moving magnet type planar motor 51 by an electromagnetic force drive method (Lorentz force drive method).

A plurality of armature coils 57 are covered with a tabular member 58 that constitutes the upper surface of base board 12. The upper surface of tabular member 58 constitutes the movement guide plane of wafer stage WST1 (and WST2) and also the pressure receiving surface of the pressurized air from the air bearings equipped in air slider 54.

Wafer table WTB1 is installed on stage main body 91 via a Z-leveling mechanism (e.g., including a voice coil motor or the like) that constitutes a part of stage drive system 124. Wafer table WTB1 is finely driven, by the Z-leveling mechanism, in the Z-axis, θx and θy directions with respect to stage main body 91. Accordingly, wafer table WTB1 is configured drivable in directions of six degrees of freedom (X, Y, Z, θx, θy, θz) with respect to base board 12, with stage drive system 124 including planar motor 51 and the Z-leveling mechanism.

Figure 2B:
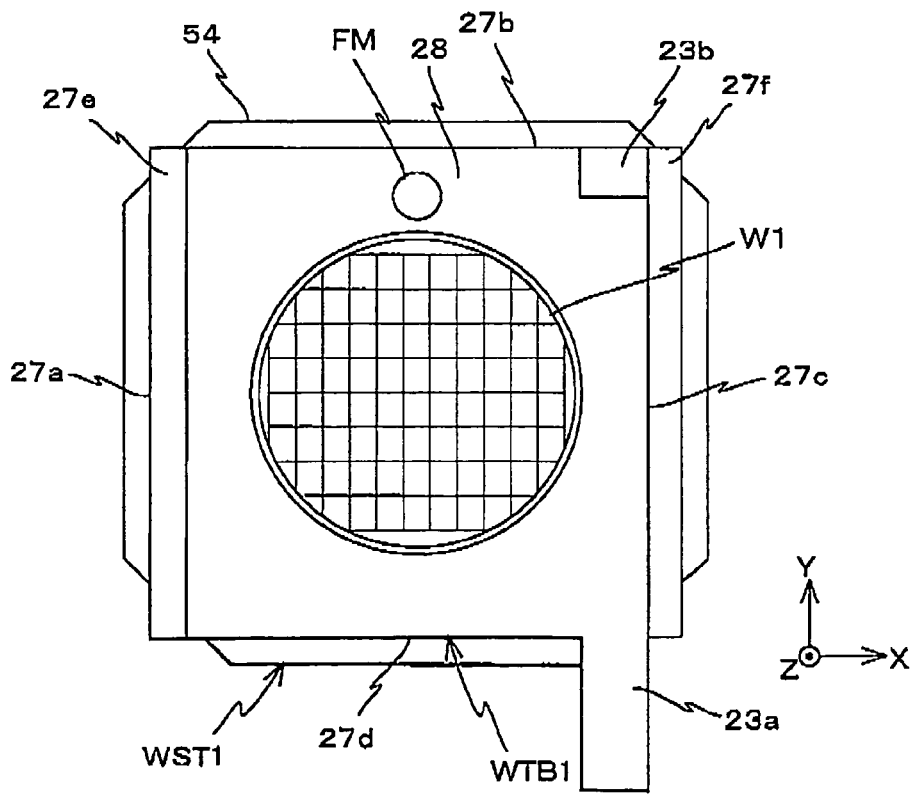
FIG. 2B is a plan view showing wafer stage WST1.

In the center of the upper surface of wafer table WTB1, a wafer holder (not shown) that holds a wafer by vacuum suction or the like is arranged. On the outer side of the wafer holder (a mounting area of a wafer), as shown in FIG. 2B, a plate 28 is arranged, having a circular opening that is slightly larger than the wafer holder and is formed in the center and having a rectangular outer shape (contour). The surface of plate 28 undergoes liquid repellent processing with respect to liquid Lq, and forms a liquid repellent surface. Incidentally, the entire area (or partial area) of the surface of plate 28 is set so as to be substantially flush with the surface of wafer W.

Further, a circular opening is formed in substantially the center on the +Y side of plate 28, and within the circular opening, a fiducial mark plate FM is fitted. The surface of fiducial mark plate FM is set substantially flush with plate 28. On the surface of fiducial mark plate FM, at least a pair of first fiducial marks to be detected by reticle alignment detection system 13 and a second fiducial mark to be detected by alignment system ALG are formed.

At a +X end on the −Y side of wafer table WTB1, as shown in FIG. 2B, a plate-shaped overhang section 23a that protrudes beyond other sections is arranged. Further, at the +X end on the +Y side of wafer table WTB1, as shown in FIG. 2B, a stepped section (a cutout section having a rectangular shape in a planar view) 23b whose width in the X-axis direction is substantially the same as that of overhang section 23a is formed. Almost the entire surface (excluding stepped section 23b) of the upper surface of wafer table WTB1 including wafer W1 and overhang section 23a forms substantially a flush surface.

As shown in the drawings such as FIG. 1 (and FIG. 4), wafer stage WST2 is configured including a stage main body 91 and a wafer table WTB2 quite similar to wafer stage WST1 described above, although wafer stage WST2 is bilaterally symmetric to wafer stage WST1.

Accordingly, at a −X end on the −Y side of wafer table WTB2, an overhang section that is the same as (or bilaterally symmetric to) overhang section 23a is arranged, and at the −X end on the +Y side, a stepped section (a cutout section having a rectangular shape in a planar view) that is bilaterally symmetric to stepped section 23b is formed. In the description below, for identification, the overhang section and the stepped section which wafer table WTB2 is equipped with are described as overhang section 23a' and stepped section 23b'.

Figure 3A:
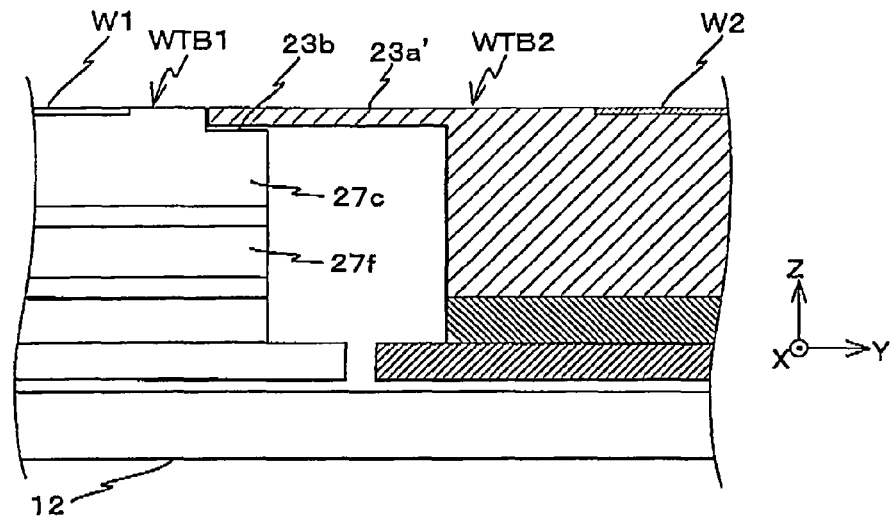
FIGS. 3A to 3C are views used to explain a delivery section.

Now, overhang sections 23a and 23a' and stepped sections 23b and 23b' are described in detail. FIG. 3A shows stepped section 23*b* arranged at wafer table WTB1 and overhang section 23*a*' arranged at wafer table WTB2 in an enlarged view. As shown in FIG. 3A, by a tip of overhang section 23*a*' arranged at wafer table WTB2 and stepped section 23*b* arranged at wafer table WTB1 engaging, wafer stages WST1 and WST2 can be in proximity or in contact in the Y-axis direction via overhang section 23*a*' and stepped section 23*b* in a state where the +Y side surface of wafer stage WST1 and the −Y side surface of wafer stage WST2 partially face, or more specifically, both wafer stages WST1 and WST2 move into a scrum state (refer to FIG. 4).

The length in the Y-axis direction of overhang section 23*a*' of wafer table WTB2 is set much longer than the length in the Y-axis direction of stepped section 23*b*, and as shown in FIG. 3A, is set to around a length long enough to prevent wafer stage WST1 and wafer stage WST2 from coming into contact (to be more precise, a +Y side end of air slider 54 of wafer stage WST1 and a −Y side end of air slider 54 of wafer stage WST2 from coming into contact) when overhang section 23*a*' and stepped section 23*b* are in an engaged state.

Overhang section 23*a* of wafer table WTB1 and stepped section 23*b*' of wafer table WTB2 have the size similar to overhang section 23*a*' and stepped section 23*b* described above, and can engage with each other in a similar manner. And, in their engaged state, wafer stage WST1 and Wafer stage WST2 can be prevented from coming into contact (to be more precise, a −Y side end of air slider 54 of wafer stage WST1 and a +Y side end of air slider 54 of wafer stage WST2 from coming into contact).

In the embodiment, in a state where wafer stages WST1 and WST2, to be more precise, overhang section 23*a*' and stepped section 23*b* (or overhang section 23*a* and stepped section 23*b*') are in proximity or in contact (a scrum state of both the wafer stages), the upper surfaces of wafer table WTB1 and wafer table WTB2 form substantially a flush surface as a whole (the completely flat surface) including the upper surface of overhang section 23*a* (or 23*a*') (refer to FIG. 3A). In this case, overhang section 23*a*' (or 23*a*) and stepped section 23*b* (or 23*b*') in proximity means, as an example, a state where overhang section 23*a*' (or 23*a*) and stepped section 23*b* (or 23*b*') approach via a clearance of around 300 µm.

Figure 4:
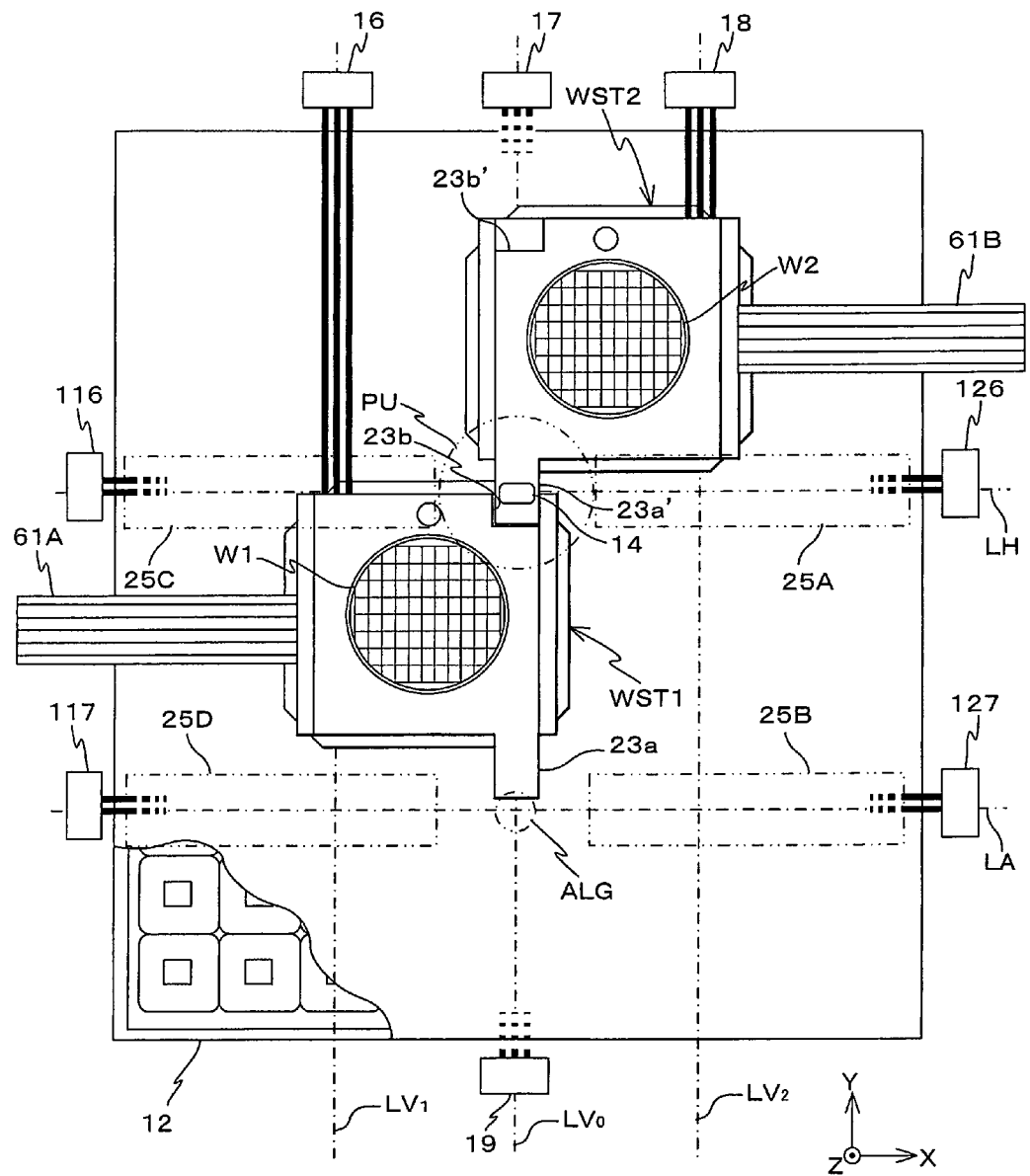
Figure 10:
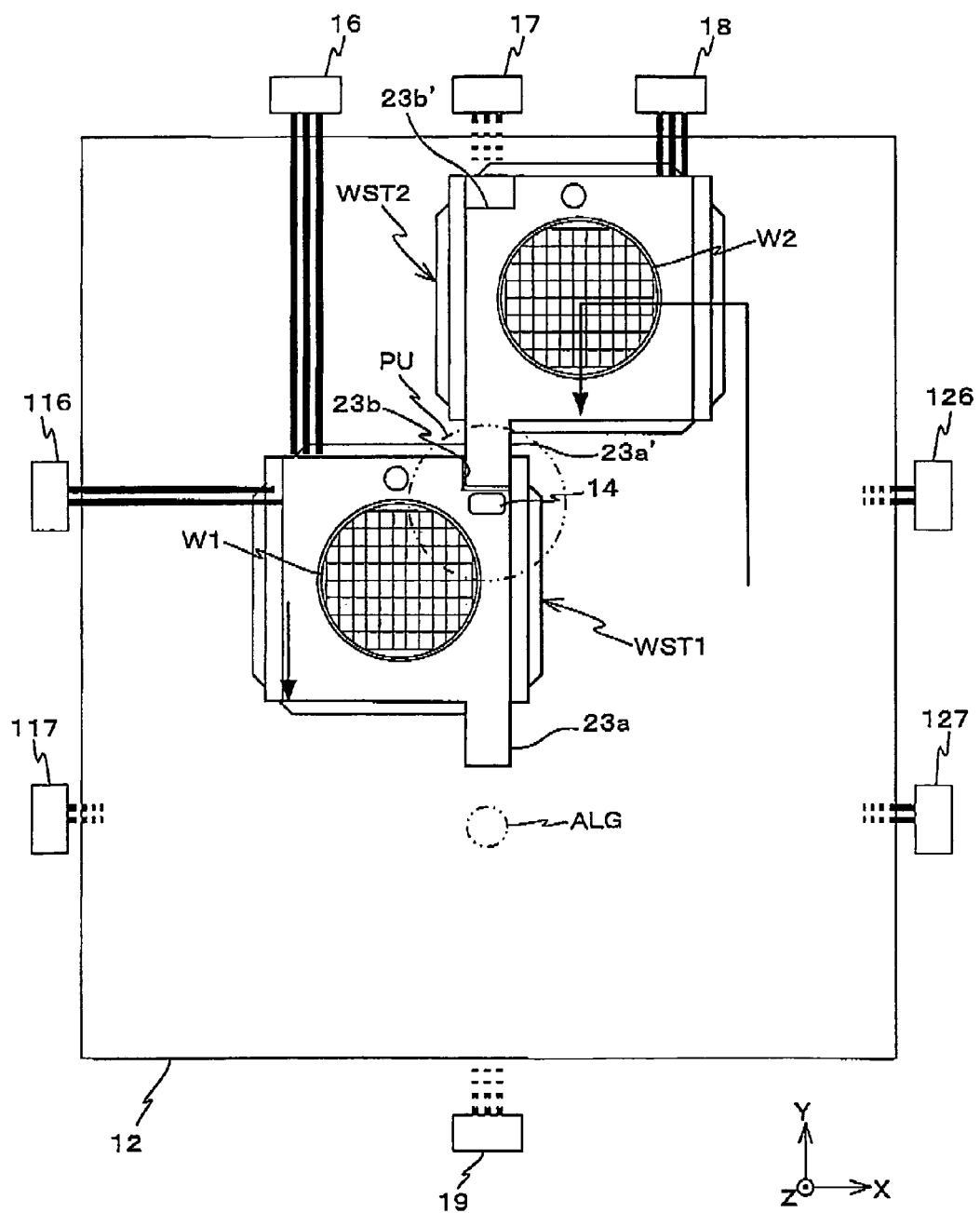
FIG. 10 is a view used to explain a state where a liquid immersion area moves from wafer stage WST1 onto wafer stage WST2, by wafer stages WST1 and WST2 moving while maintaining their scrum state.

As shown in FIG. 4, the width in the X-axis direction of overhang section 23*a*' (and 23*a*) is set sufficiently larger than the width of liquid immersion area 14 described previously, e.g. set to around 100 mm, or to be more precise, less than or equal to 100 mm (80 mm to 100 mm, as an example). Accordingly, for example, in order to start exposure to wafer W2 mounted on wafer table WTB2 after exposure to wafer W1 mounted on wafer table WTB1 has been completed, wafer stage WST1, which is located in an exposure-time movement area AE (refer to FIGS. 7 and 8) including an area under projection optical system PL where liquid immersion area 14 is formed, has to be withdrawn from exposure-time movement area AE, and wafer stage WST2 waiting at a predetermined standby position has to be moved to exposure-time movement area AE. On this operation, as shown in FIG. 10 for example, main controller 20 makes wafer stages WST1 and WST2 be in proximity or in contact in the Y-axis direction by engaging stepped section 23*b* and overhang section 23*a*' that wafer stages WST1 and WST2 respectively have. Then, while maintaining this state (the scrum state), main controller 20 drives both wafer stages WST1 and WST2 in the −Y direction, thereby liquid immersion area 14 sequentially moves on the upper surfaces of wafer table WTB1, overhang section 23*a*', and wafer table WTB2.

Figure 3B:
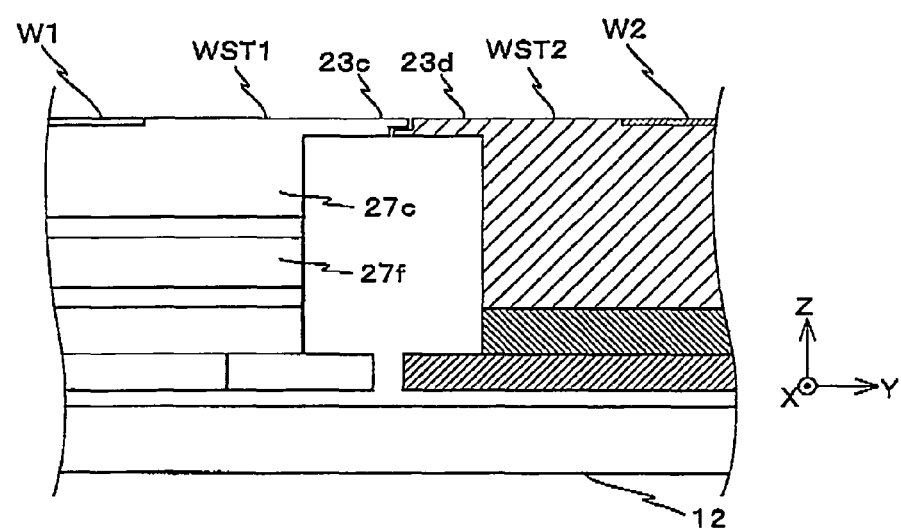
Figure 3C:
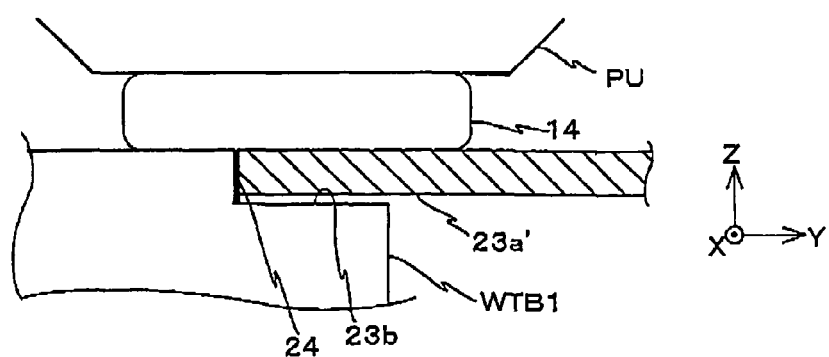

When liquid immersion area 14 moves from wafer table WTB1 onto wafer table WTB2 via overhang section 23*a*' (or moves from wafer table WTB2 onto wafer table WTB1 via overhang section 23*a*), liquid Lq that forms liquid immersion area 14 could enter a gap between overhang section 23*a*' and stepped section 23*b* (or a gap between overhang section 23*a* and stepped section 23*b*'), and leak below wafer stage WST1 and/or wafer stage WST2 via the side surface(s) of wafer stage(s) WST1 and/or WST2. Therefore, for example, as shown in FIG. 3C, a seal member 24 should be pasted on a part of the surface of stepped section 23*b* that engages with overhang section 23*a*', or otherwise, on a part of the surface of overhang section 23*a*' that engages with stepped section 23*b*, or on the surfaces of both overhang section 23*a*' and stepped section 23*b* that engage. In such a case, seal member 24 can prevent the liquid from entering the gap between overhang section 23*a*' and stepped section 23*b*, and thus from leaking below wafer stage(s) WST1 and/or WST2. Incidentally, as seal member 24, for example, an elastic seal member made of fluorine-containing rubber or the like is used. Further, instead of pasting seal member 24, water repellent coat can be applied with Teflon (registered trademark) or the like to the engaged surface of overhang section 23*a*' with stepped section 23*b*, and/or the engaged surface of stepped section 23*b* with overhang section 23*a*'. Incidentally, the same as above can be said also for stepped section 23*b*' and overhang section 23*a*.

In the embodiment, as is described above, liquid immersion area 14 can be moved between wafer tables WTB1 and WTB2 via overhang section 23*a* or 23*a*'. On this movement, since a state where overhang section 23*a* and stepped section 23*b*' (or overhang section 23*a*' and stepped section 23*b*) are in proximity or in contact is maintained, liquid Lq of liquid immersion area 14 can be prevented from leaking from a gap between the overhang section and the stepped section as well. Accordingly, an operation of recovering liquid Lq from below projection optical system PL becomes unnecessary, and therefore the throughput can be improved compared with the case where recovery and supply of liquid Lq are performed.

Incidentally, in the description above, the overhang section is arranged at a −Y side end of wafer tables WTB1 and WTB2 and the stepped section is arranged at a +Y side end of wafer tables WTB1 and WTB2, respectively, but conversely, the overhang section can be arranged at the +Y side end of wafer tables WTB1 and WTB2, and the stepped section can be arranged at the −Y side end of the wafer tables, as in a modified example which will be described later on. Besides the arrangements described above, as shown in FIG. 3B, a pair of tabular protruding sections 23*c* and 23*d* that engage with each other can be arranged on the +Y side of an upper end of wafer table WTB1 and on the −Y side of an upper end of wafer table WTB2. In this case, a raised section whose upper half protrudes compared with a lower half can be formed at a tip of one of the protruding sections, protruding section 23*c*, while a raised section whose lower half protrudes compared with an upper half, which engages with the raised section of protruding section 23*c*, and which forms a plate-shaped section as a whole in the engaged state as shown in FIG. 3B, can be formed at a tip of the other of the protruding sections, protruding section 23*d*. In this case as well, the length of protruding sections 23*c* and 23*d* only has to be set to a length with which the contact of wafer stages WST1 and WST2 can be avoided in the scrum state of both wafer stages WST1 and WST2 where protruding sections 23*c* and 23*d* are fitted. As a matter of course, it is also possible that a pair of tabular protruding sections that engage with each other are arranged on the +Y side of an upper end of wafer table WTB2 and on the −Y side of an upper end of wafer table WTB1.

Further, in the embodiment, overhang section 23*a* (or 23*a*') and stepped section 23*b*' (or 23*b*) (or a pair of protruding sections 23c and 23d) that engage with each other are arranged on the ±X side ends on the ±Y side that face each other at the time of proximity or contact (at the time of scrum) of each of wafer stages WST1 and WST2, and both wafer stages WST1 and WST2 move into the scrum state while being shifted in the X-axis direction. This is because the reasons a. to c. below are mainly taken into consideration.

a. By making both wafer stages WST1 and WST2 scrum (be in proximity or in contact) in the Y-axis direction which is a direction connecting an exposure position (liquid immersion area 14) where exposure of a wafer is performed and a position where alignment of a wafer is performed, a movement distance (movement stroke) of both wafer stages WST1 and WST2 can be shortened, compared with the case where both wafer stages WST1 and WST2 are made to scrum in the X-axis direction. Accordingly, the throughput can be improved.

b. By making both wafer stages WST1 and WST2 move into the scrum state while being shifted in the X-axis direction, the movement stroke of both wafer stages WST1 and WST2 can be further shortened, which allows the throughput to improve further.

c. The lengths of cables (to be described later) that are connected to each of wafer stages WST1 and WST2 can be shortened.

Incidentally, on wafer stages WST1 and WST2, various measurement devices and measurement members such as an aerial image measuring device, a confidential bar (CD bar), an uneven illuminance measuring sensor, an aerial image measuring instrument, a wavefront aberration measuring instrument, and an illuminance monitor can also be arranged, as is disclosed in, for example, the pamphlet of International Publication No. 2007/097379.

In the embodiment, cables 61A for wiring/piping are connected from a −X side end of wafer stage WST1 to a first cable shuttle (not shown) that is installed on the −X side of base board 12 (the movement guide plane of wafer stages WST1 and WST2) and is movable in the Y-axis direction. Similarly, cables 61B for wiring/piping are connected from a +X side end of wafer stage WST2 to a second cable shuttle (not shown) that is installed on the +X side of base board 12 and is movable in the Y-axis direction. With these cables 61A and 61B, electric power supply to the Z-leveling mechanisms and the measurement devices which are arranged on both wafer stages WST1 and WST2, and supply of pressurized air to the air sliders, and the like are performed.

Next, interferometer system 118 that constitutes a part of measurement system 200 is described.

As representatively shown using wafer table WTB1 in FIG. 2B, on a −X side end surface, a +Y side end surface, a +X side end surface and a −Y side end surface of each of wafer tables WTB1 and WTB2, reflection surfaces 27a, 27b, 27c and 27d are formed respectively. Further, on surfaces on the −X side and the +X side of each of wafer stages WST1 and WST2, reflection mirrors 27e and 27f having a reflection surface inclined at an angle of 45 degrees with respect to reflection surfaces 27a and 27c respectively (refer to FIG. 5). Further, as shown in FIGS. 1 and 4, a rectangular-plate-shaped fixed mirrors 25A, 25C, 25B and 25D are placed on the +X side and −X side of projection unit PU and on the +X side and −X side of alignment system ALG, with their longitudinal directions in the X-axis direction and their reflection surfaces facing the −Z direction. The reflection surfaces of fixed mirrors 25A, 25C, 25B and 25D can face wafer stage WST1 or WST2 (wafer table WTB1 or WTB2). Fixed mirrors 25A to 25D are installed on the lower surface of the main frame that holds projection unit PU and the like.

As shown in FIG. 4, interferometer system 118 includes four Y interferometers 16, 17, 18 and 19, and four XZ interferometers 116, 117, 126 and 127. Y interferometers 16, 17 and 18 are placed on the +Y side of base board 12 at different positions in the X-axis direction. Y interferometer 19 is placed on the −Y side of base board 12 so as to face Y interferometer 17. XZ interferometers 116 and 117 are placed a predetermined distance apart in the Y-axis direction, on the −X side of base board 12. Further, XZ interferometers 126 and 127 are placed on the +X side of base board 12 so as to face XZ interferometers 116 and 117 respectively.

Figure 5:
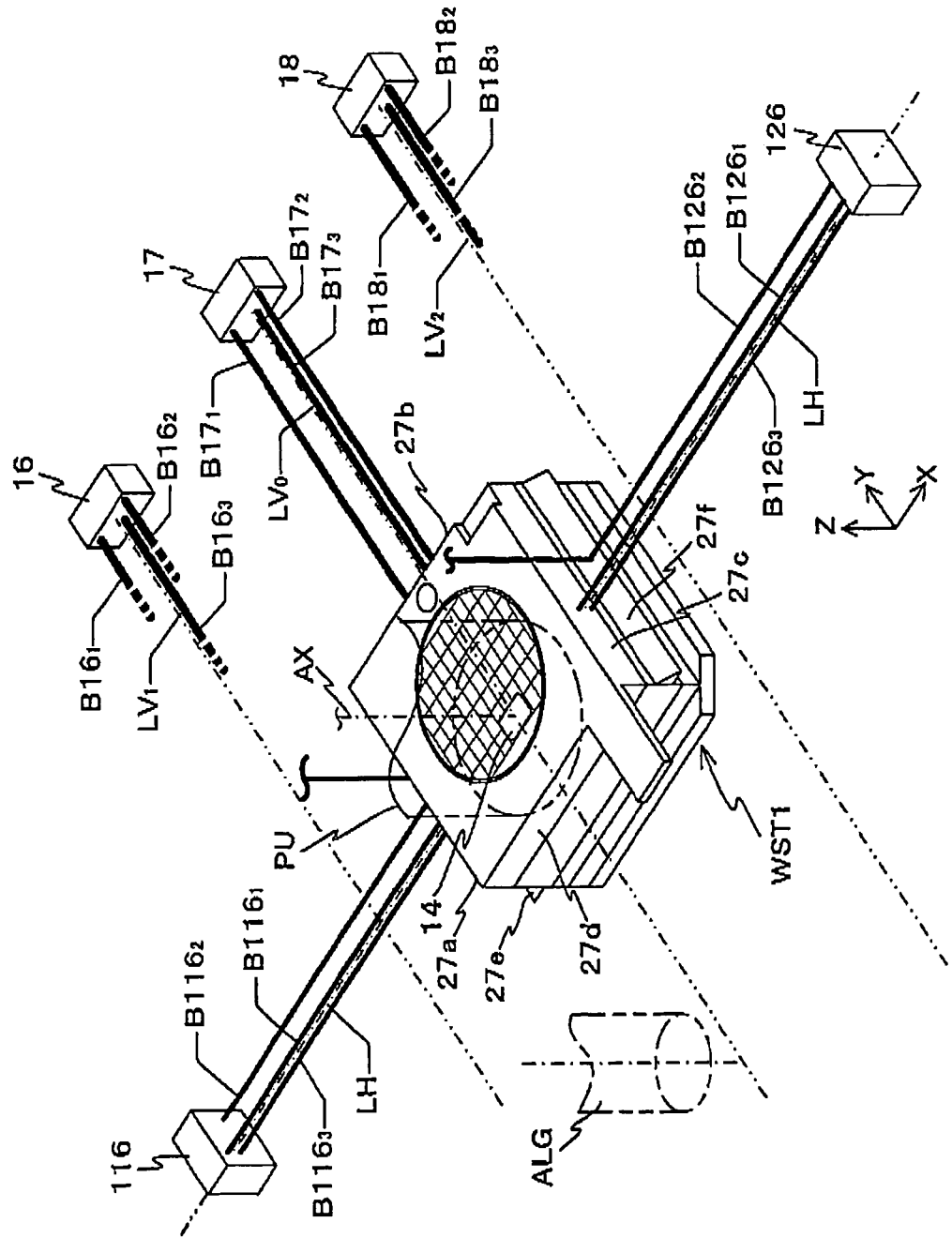
FIG. 5 is a view used to explain position measurement of the wafer stage using three multiaxial interferometers.

To be more specific, as shown in FIG. 5, Y interferometer 17 irradiates reflection surface 27b of wafer stage WST1 (or WST2) with two measurement beams $B17_1$ and $B17_2$ parallel to the Y-axis, which are an equal distance apart in the ±X direction from a straight line (a reference axis) $LV_0$ parallel to the Y-axis connecting optical axis AX of projection optical system PL and the detection center of alignment system ALG, and receives reflected lights of measurement beams $B17_1$ and $B17_2$, thereby measuring displacements of reflection surface 27b in the Y-axis direction at irradiation points of measurements beams $B17_1$ and $B17_2$ (which are to be first positional information and second positional information). The first positional information and the second positional information are sent to main controller 20. Based on the average value of the first positional information and the second positional information, main controller 20 computes the position in the Y-axis direction (Y-position) of wafer stage WST1 (or WST2). More specifically, a substantial measurement axis of Y interferometer 17 in the Y-axis direction coincides with reference axis $LV_0$. Further, based on the difference between the first positional information and the second positional information, main controller 20 computes rotational information in the θz direction (a yawing amount) of wafer stage WST1 (or WST2).

Further, Y interferometer 17 irradiates reflection surface 27b with another measurement beam $B17_3$ that is a predetermined distance apart from measurement beams $B17_1$ and $B17_2$ in the −Z direction, and receives a reflected light of measurement beam $B17_3$, thereby measuring a displacement of reflection surface 27b in the Y-axis direction at an irradiation point of measurement beam $B17_3$ (which is to be third positional information), and sends the third positional information to main controller 20. Based on the third positional information, and the first and second positional information, main controller 20 computes rotational information in the ex direction (a pitching amount) of wafer table WTB1 (or WTB2).

Similar to Y interferometer 17, Y interferometers 16, 18 and 19 are used to measure the Y-position, the pitching amount, and the yawing amount of one of or both of wafer tables WTB1 and WTB2. Y interferometers 16 and 18 have measurement axes $LV_1$ and $LV_2$, respectively, parallel to reference axis $LV_0$. And, Y interferometer 19 uses reference axis $LV_0$ as a substantial measurement axis, and irradiates reflection surface 27d of wafer table WTB1 (or WTB2) with three measurement beams.

XZ interferometers 116 and 126 use a reference axis LH orthogonal to optical axis AX of projection optical system PL and reference axis $LV_0$, as a measurement axis in the X-axis direction. More specifically, as shown in FIG. 5, XZ interferometer 116 irradiates reflection surface 27a of wafer table WTB1 (or WTB2) with a measurement beam $B116_1$ along measurement axis LH, and receives a reflected light of measurement beam $B116_1$ reflected off reflection surface 27a, thereby measuring a displacement of reflection surface 27a in the X-axis direction at an irradiation point of measurement beam $B116_1$ (which is to be fourth positional information). Similarly, XZ interferometer 126 irradiates reflection surface 27c of wafer table WTB1 (or WTB2) with a measurement beam $B126_1$ along measurement axis LH, and receives a reflected light of measurement beam $B126_1$ reflected off measurement surface 27c, thereby measuring a displacement of reflection surface 27c in the X-axis direction at an irradiation point of measurement beam $B126_1$ (which is to be fifth positional information). The fourth positional information and the fifth positional information are sent to main controller 20. Based on the fourth and the fifth positional information, main controller 20 computes the X-position of wafer table WTB1 (or WTB2).

Further, XZ interferometer 116 irradiates the reflection surface of reflection mirror 27e arranged on wafer table WTB1 (or WTB2) with a measurement beam (a Z measurement beam) $B116_2$ parallel to measurement axis LH. Measurement beam $B116_2$ is reflected off reflection mirror 27e in the +z direction, and is irradiated on the reflection surface of fixed mirror 25C described previously. The reflected light of measurement beam $B116_2$ from the reflection surface of fixed mirror 25C inversely traces the original optical path and is received by XZ interferometer 116. XZ interferometer 116 measures (the change in) the optical path length of measurement beam $B116_2$ and sends the measurement result to main controller 20. Similarly, XZ interferometer 126 irradiates the reflection surface of reflection mirror 27f arranged on wafer table WTB1 (or WTB2) with a measurement beam (Z measurement beam) $B126_2$ parallel to measurement axis LH. Measurement beam $B126_2$ is reflected off reflection mirror 27f in the +Z direction and is irradiated on the reflection surface of fixed mirror 25A described previously. The reflected light of measurement beam $B126_2$ from the reflection surface of fixed mirror 25A inversely traces the original optical path and is received by XZ interferometer 126. XZ interferometer 126 measures (the change in) the optical path length of measurement beam $B126_2$ and sends the measurement result to main controller 20.

Main controller 20 computes the Z-position (to be described as Ze) of an irradiation point of measurement beam $B116_2$ on the reflection surface of reflection mirror 27e, from the difference between the optical path length of measurement beam $B116_1$ obtained from the fourth positional information described previously and the optical path length of measurement beam $B116_2$.

Further, main controller 20 computes the Z-position (to be described as Zf) of an irradiation point of measurement beam $B126_2$ on the reflection surface of reflection mirror 27f, from the difference between the optical path length of measurement beam $B126_1$ obtained from the fifth positional information described previously and the optical path length of measurement beam $B126_2$. Moreover, main controller 20 computes the Z-position and rotational information in the θy direction (a rolling amount) of wafer table WTB1 (or WTB2), from the average value of two Z-positions Ze and Zf and the difference between the Z-positions Ze and Zf.

Furthermore, as shown in FIG. 5, XZ interferometers 116 and 126 irradiate reflection surfaces 27a and 27c with measurement beams $B116_3$ and $B126_3$, respectively, which are parallel to measurement axis LH but are a predetermined distance apart from measurement beams $B116_1$ and $B126_1$ in the −Z direction. Then, XZ interferometers 116 and 126 receive reflected lights of measurement beams $B116_3$ and $B1126_3$, and measure displacements of reflection surfaces 27a and 27c in the X-axis direction at irradiation points of measurement beams $B116_3$ and $B126_3$ (which are to be sixth positional information and seventh positional information).

The sixth positional information and the seventh positional information are sent to main controller 20. Based on the fourth positional information and the sixth positional information, main controller 20 computes a rolling amount (which is to be θy1) of wafer table WTB1 (or WTB 2). And, based on the fifth positional information and the seventh positional information, main controller 20 computes a rolling amount (which is to be θy2) of wafer table WTB1 (or WTB 2). Further, based on the Z position (Ze) and the rolling amount θy1 described above, main controller 20 computes the Z-position of wafer table WTB1 (or WTB2). Further, based on the Z position (Zf) and the rolling amount θy2 described above, main controller 20 computes the Z-position of wafer table WTB1 (or WTB2).

However, an interspace distance between measurement beams $B116_1$ and $B116_3$ and an interspace distance between measurement beams $B126_1$ and $B126_3$ are much shorter, compared with a distance in the X-axis direction between the irradiation points of measurement beams (Z measurement beams) $B116_2$ and $B126_2$ on the reflection surfaces of reflection mirrors 27e and 27f. Accordingly, the measurement precision of the rolling amount of wafer table WTB1 (or WTB2) is inferior, compared with measurement that uses Z measurement beams $B116_2$ and $B126_2$ described previously. Therefore, main controller 20 performs measurement of the positional information in the θy direction (the rolling amount) and the Z-position of wafer table WTB1 (or WTB2), in principle, by using Z measurement beams $B116_2$ and $B126_2$, or more specifically, using both XZ interferometers 116 and 126, and exceptionally, as an alternative method, performs the measurement by using only either one of XZ interferometer 116 or 126. Incidentally, a usage example of the alternative method is described later on.

Similar to XZ interferometers 116 and 126, Xz interferometers 117 and 127 are used to measure the X-position, the Z-position, and the position in the θy direction (the rolling amount) of wafer table WTB1 (or WTB2) when performing wafer alignment or the like. Incidentally, the measurement method is similar to the measurement using XZ interferometers 116 and 126, except for the point that a reference axis LA (refer to FIG. 4) parallel to the X-axis which is orthogonal to reference axis $LV_0$ at the detection center of alignment system ALG serves as a measurement axis, and the point that fixed mirrors 25D and 25B are respectively used as fixed mirrors to which Z measurement beams are irradiated.

As is described above, by using interferometer system 118 that includes Y interferometers 16, 17, 18 and 19, and Xz interferometers 116, 117, 126 and 127, positional information in directions of six degrees of freedom (X, Y, Z, θx, θy, θz) of wafer table WTB1 (or WTB2) can be measured. Incidentally, in the embodiment, according to the placement of the respective interferometers, main controller 20 uses Y interferometer 17 and XZ interferometers 116 and 126 in exposure-time movement area AE, and uses Y interferometer 19 and XZ interferometers 117 and 127 in an alignment area AA (refer to FIG. 8) close to alignment system ALG where wafer stages WST1 and WST2 move when wafer alignment is performed. Further, main controller 20 uses Y interferometer 16 and XZ interferometers 116 and 126 or 117 and 127 in a standby area (an area on the −X side on base board 12) where wafer stage WST1 comes and goes between exposure-time movement area AE and alignment area AA, and uses Y interferometer 18 and XZ interferometers 116 and 126 or 117 and 127, in a standby area (an area on the +X side on base board 12) where wafer stage WST2 comes and goes between exposure-time movement area AE and alignment area AA.

In the embodiment, in order to measure positional information of wafer table WTB1 (or WTB2) within the XY plane, an encoder system 150 (refer to FIG. 6) is arranged separately from interferometer system 118 described above. Therefore, main controller 20 performs position measurement of wafer table WTB1 (or WTB2) mainly using interferometer system 118, and uses encoder system 150 when wafer stage WST is located in areas other than a measurement area of interferometer system 118. As a matter of course, main controller 20 can perform position measurement of wafer table WTB1 (or WTB2) within the XY plane using interferometer system 118 and encoder system 150 together.

FIG. 6 shows a main configuration of a control system of exposure apparatus 100. This control system is mainly configured of main controller 20 composed of a microcomputer (or a workstation) that performs overall control of the entire apparatus.

Next, a parallel processing operation using wafer stages WST1 and WST2 is described with reference to FIGS. 7 to 12, and FIG. 4. Incidentally, during the operation below, liquid supply device 5 and liquid recovery device 6 are controlled by main controller 20, liquid Lq is supplied/recovered to/from a space directly under tip lens 191 of projection optical system PL, and a constant quantity of liquid Lq is held, and thereby liquid immersion area 14 is constantly formed.

Figure 7:
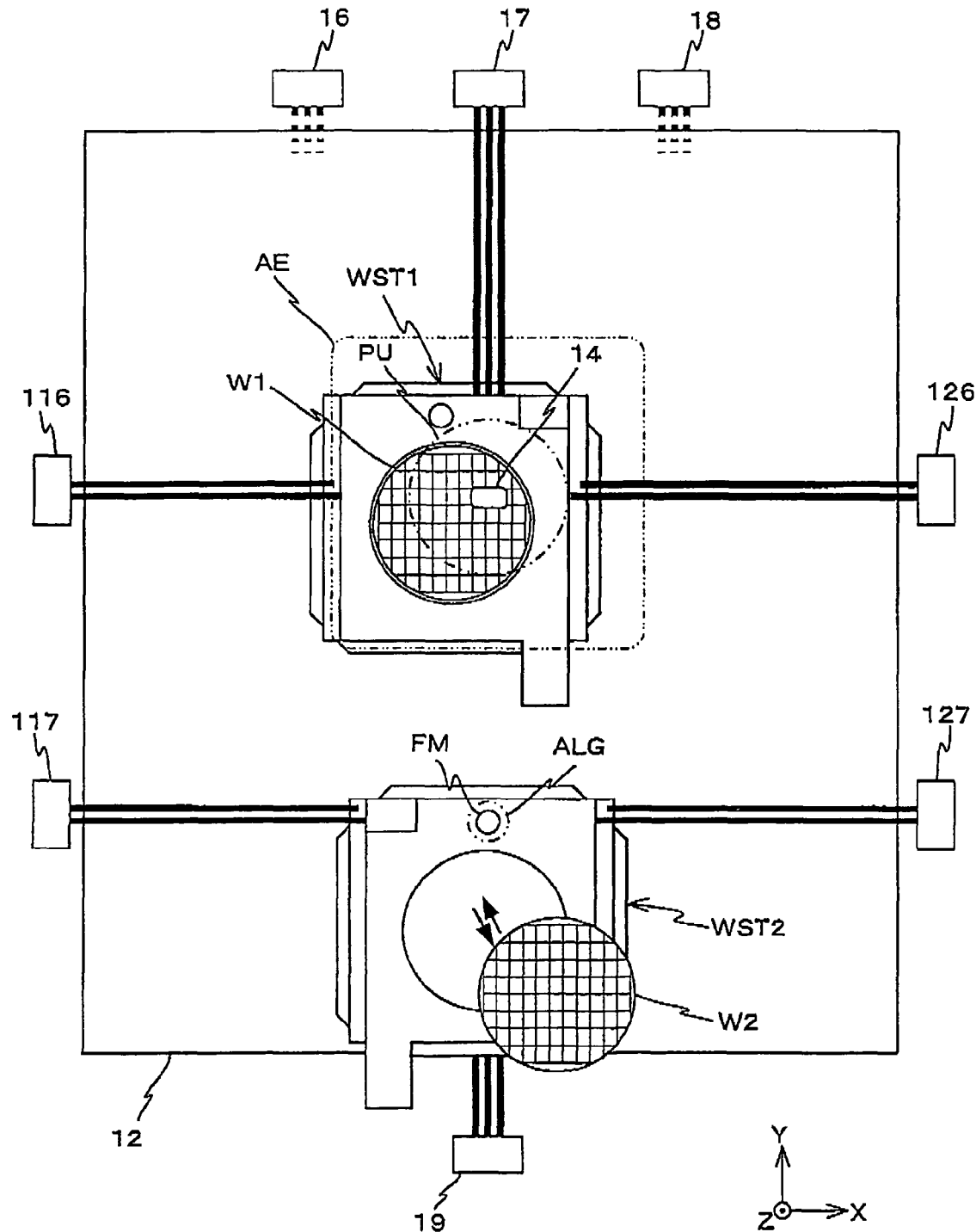
FIG. 7 is a view showing a state where exposure is performed to a wafer mounted on wafer stage WST1, while wafer exchange is performed on a wafer stage WST2.

FIG. 7 shows a state where exposure by a step-and-scan method is performed to wafer W1 mounted on wafer stage WST1, and in parallel with the exposure, wafer exchange is performed between a wafer carrier mechanism (not shown) and wafer stage WST2 at a loading position. In this case, in the embodiment, the loading position is assumed to be set at a position of wafer stage WST1 or WST2 with which fiducial mark plate FM is positioned directly under alignment system ALG.

While wafer stage WST2 stops at the loading position during the wafer exchange described above and after the wafer exchange, main controller 20 executes reset (re-setting of the origins) of Y interferometer 19 and XZ interferometers 117 and 127, prior to start of wafer alignment (and other preprocessing measurement) to a new wafer W2.

When the wafer exchange (the loading of new wafer W2) and the reset of interferometers 19, 117 and 127 are completed, main controller 20 detects a second fiducial mark on fiducial mark plate FM of wafer stages WST using alignment system ALG. And, main controller 20 detects the position of the second fiducial mark with the index center of alignment system ALG serving as a reference, and based on the detection result and the result of position measurement of wafer stage WST2 obtained by interferometers 19, 117 and 127 at the time of the detection, main controller 20 computes the position coordinate of the second fiducial mark in an orthogonal coordinate system (an alignment coordinate system) with reference axis LA and reference axis $LV_0$ serving as coordinate axes.

Figure 8:
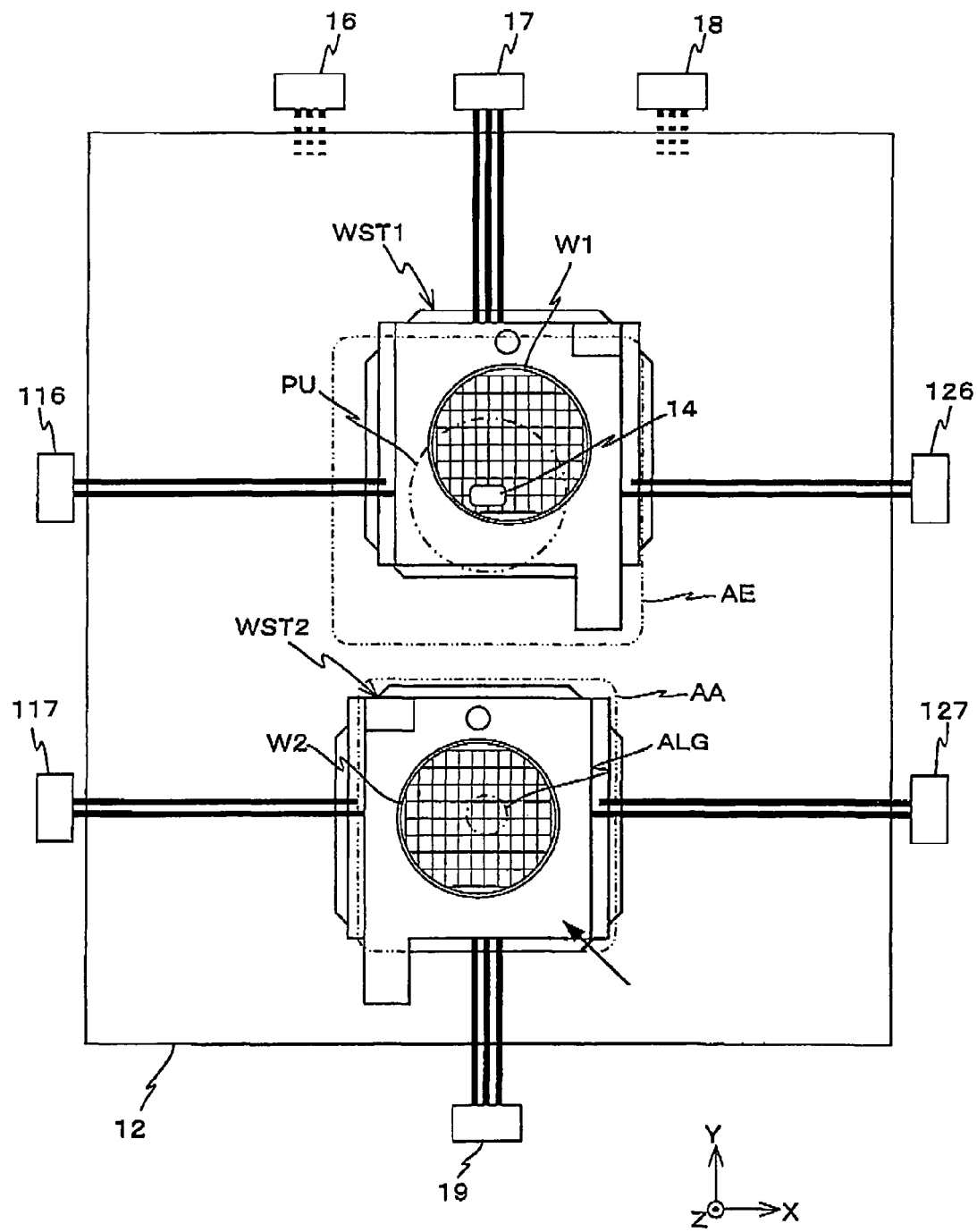
FIG. 8 is a view showing a state where exposure is performed to a wafer mounted on wafer stage WST1, while wafer alignment is performed to a wafer mounted on wafer stage WST2.

Next, main controller 20 moves wafer stage WST2 to alignment area AA, as shown in FIG. 8. Then, while measuring the position coordinate of wafer stage WST2 in the alignment coordinate system using interferometers 19, 117 and 127, main controller 20 performs Enhanced Global Alignment (EGA). To be more specific, while controlling the position coordinate of wafer stage WST2 using interferometers 19, 117 and 127, main controller 20 detects a plurality of alignment marks arranged at a plurality of specific shot areas (sample shot areas) on wafer W2 using alignment system ALG, and obtains the position coordinates of the alignment marks. Based on the obtained position coordinates and designed position coordinates, main controller 20 computes position coordinates of a plurality of shot areas in the alignment coordinate system by executing a statistical computation which is disclosed in, for example, U.S. Pat. No. 4,780,617 and the like. Furthermore, main controller 20 obtains position coordinates of a plurality of shot areas on wafer W2 with the position of the second fiducial mark serving as an origin, by reducing the position coordinate of the second fiducial mark detected previously from the computed position coordinates.

Normally, the wafer exchange/wafer alignment sequence described above is completed earlier than an exposure sequence. Therefore, when the wafer alignment is completed, main controller 20 moves wafer stage WST2 to a predetermined standby position, and during the movement, switches an interferometer to be used for measurement of positions of wafer table WTB2 in the Y-axis direction, the θx direction and the θz direction from Y interferometer 19 to Y interferometer 18. Then, main controller 20 makes wafer stage WST2 wait at the predetermined standby position until exposure to wafer W1 on wafer stage WST1 is completed.

Figure 9:
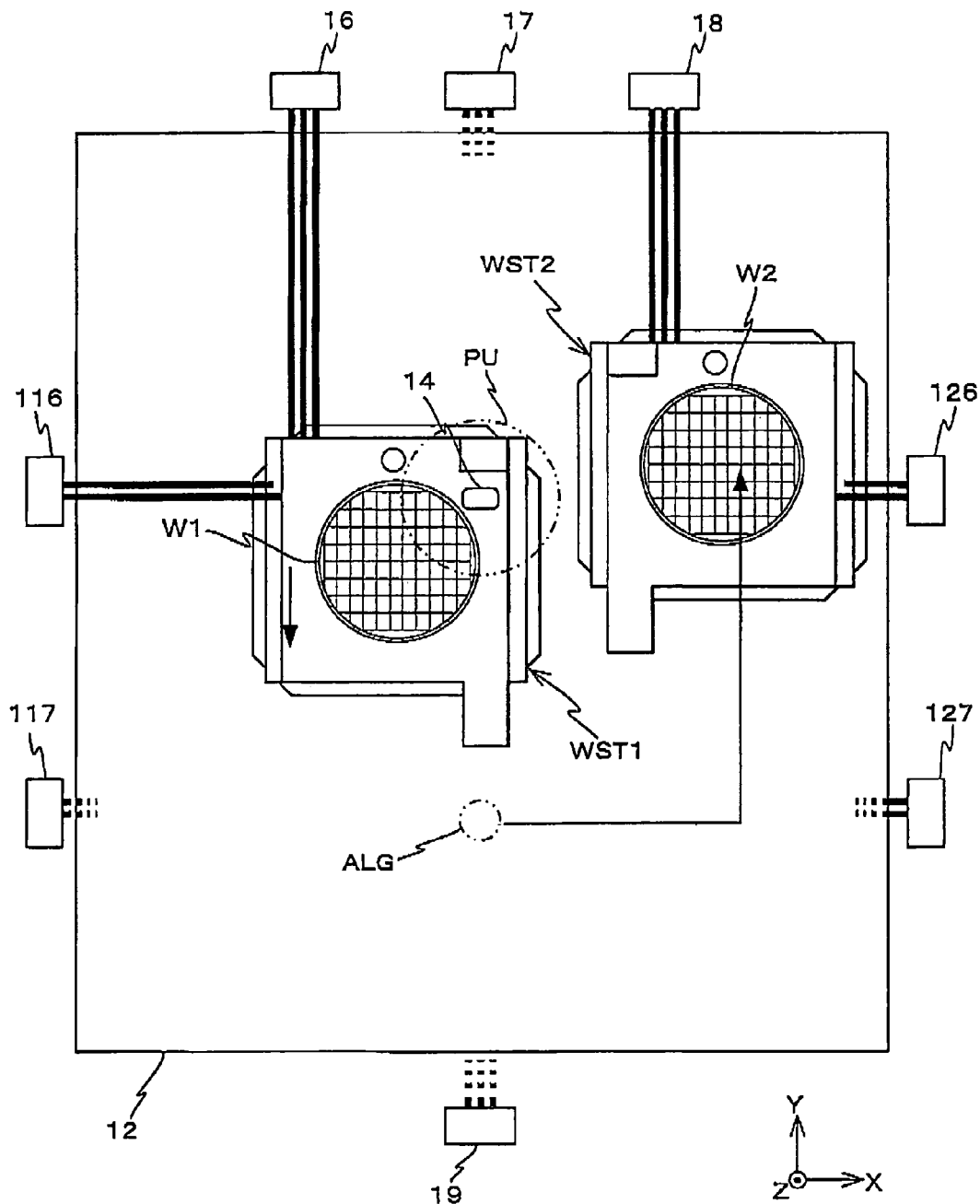
FIG. 9 is a view showing a state where X, Z and θy positions of a wafer table WTB1 are measured using only an XZ interferometer 116, and X, Z and θy positions of a wafer table WTB2 are measured using only an XZ interferometer 126.

When exposure to wafer W1 on wafer table WTB1 has been completed, main controller 20 starts drive of each of wafer stages WST1 and WST2 to a first scrum position shown in FIG. 10. After starting movement of wafer stage WST1 to the first scrum position, main controller 20 switches a Y interferometer to be used for position measurement of wafer stage WST1 from Y interferometer 17 to Y interferometer 16. Further, on this operation, three measurement beams of XZ interferometer 126 irradiated to wafer stage WST1 are cut off by wafer stage WST2 that is moving toward the first scrum position, as shown in FIG. 9, and it becomes impossible to perform measurement of the position of wafer stage WST1 using XZ interferometer 126. Therefore, main controller 20 measures the X, Z, θy positions of wafer table WTB1 using only XZ interferometer 116. In this case, main controller 20 uses the alternative method referred to earlier to measure the θy position and the Z position. Meanwhile, as is obvious from FIG. 9, the measurement beams from XZ interferometers 117 and 127 move off of wafer stage WST2 in the middle of the movement of wafer stage WST2 toward the first scrum position described above, and a situation arises where the measurement beams of any XZ interferometers are not irradiated to wafer stage WST2. Therefore, prior to this situation arising, main controller 20 starts measurement of the X-position of wafer stage WST2 using encoder system 150 described earlier. Then, at the point in time when the three measurement beams from XZ interferometer 126 begin to be irradiate to the respective reflection surfaces of wafer stage WST2, main controller 20 pre-sets XZ interferometer 126 based on the measurement values of encoder system 150. Further, in the state as shown in FIG. 9, the three measurement beams of XZ interferometer 116 are cut off by wafer stage WST1, and therefore main controller 20 measures the X, Z and θy-positions of wafer table WTB2 using only XZ interferometer 126. Also in this case, main controller 20 uses the alternative method described earlier to measure the θy-position and the Z-position.

Incidentally, in the embodiment, when wafer stages WST1 and WST2 are located side by side in the X-axis direction (at least partially face), similar to the location as shown in FIG. 9, while both wafer stages WST1 and WST2 are moving, main controller 20 measures the X, Z and θy-positions of wafer table WTB1 using only XZ interferometer 116 and also measures the X, Z and θy-positions of wafer table WTB2 using only XZ interferometer 126, similar to the manner described above.

Then, in a state where both wafer stages WST1 and WST2 have moved to the first scrum position, as is described earlier, overhang section 23a' of wafer stage WST2 and stepped section 23b of wafer stage WST1 engage and wafer stages WST1 and WST2 come into a scrum state where both wafer stages WST1 and WST2 are in proximity or in contact via overhang section 23a' and stepped section 23b. Main controller 20 drives both wafer stages WST1 and WST2 in the −Y direction while keeping the scrum state.

As wafer stages WST1 and WST2 move in the −Y direction while keeping the scrum state, liquid immersion area 14 formed between tip lens 191 and wafer table WTB1 sequentially moves onto wafer table WTB1, overhang section 23a', and wafer table WTB2. FIG. 4 shows a state of both wafer stages WST1 and WST2 when liquid immersion area 14 goes across overhang section 23a' to move from wafer table WTB1 onto wafer table WTB2 in the middle of this movement.

Figure 11:
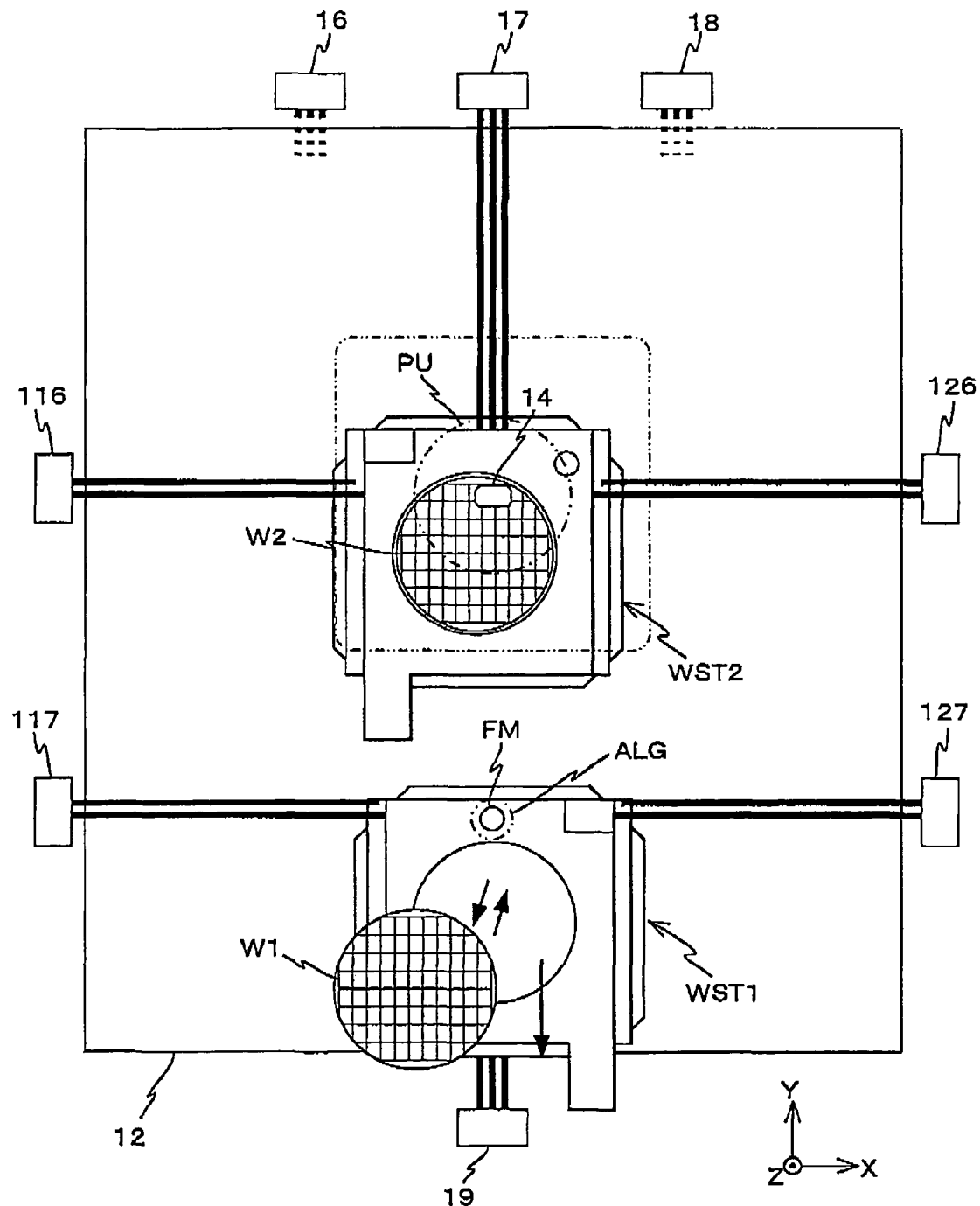
FIG. 11 is a view showing a state where exposure is performed to a wafer mounted on wafer stage WST1, while wafer exchange is performed on wafer stage WST2.

When the movement of liquid immersion area 14 onto wafer table WTB2 has been completed, main controller 20 moves wafer stage WST1 to the loading position as shown in FIG. 11.

As is obvious also from FIG. 11, in the middle of the movement of wafer stage WST1 toward the loading position described above, the measurement beam from XZ interferometer 116 moves off of wafer stage WST1, and the situation arises where the measurement beams from any XZ interferometers are not irradiated to wafer stage WST1. Therefore, prior to this situation arising, main controller 20 starts measurement of the X-position of wafer stage WST1 using encoder system 150 described earlier. Then, at the point in time when the three measurement beams from each of XZ interferometers 117 and 127 begin to be irradiated to the respective reflection surfaces of wafer stage WST1, main controller 20 pre-sets XZ interferometers 117 and 127 based on the measurement values of encoder system 150. After that, while measuring the position using interferometers 16, 117 and 127, main controller 20 further drives wafer stage WST1 toward the loading position.

In parallel with the movement of wafer stage WST1 described above, main controller 20 drives wafer stage WST2 and sets the position of fiducial mark plate FM of wafer stage WST2 directly under projection optical system PL. Then, main controller 20 detects a pair of the first fiducial marks on fiducial mark plate FM using reticle alignment detection system 13 (refer to FIG. 6), and detects the relative positions of images, of reticle alignment marks on reticle R, projected on the wafer surface that correspond to the first fiducial marks. Incidentally, this detection is performed via projection optical system PL and liquid Lq that forms liquid immersion area 14.

Based on relative positional information detected as above and the positional information of each shot area on wafer W2 with the second fiducial mark serving as a reference that has been obtained previously, main controller 20 computes a relative positional relation between a projection position of a pattern of reticle R (the projection center of projection optical system PL) and each shot area on wafer W2. Based on the computation results, main controller 20 transfers the pattern of reticle R to each shot area on wafer W2 in the step-and-scan method while controlling the position of wafer stage WST2, in a similar manner to the case of wafer W1 described previously.

In parallel with the exposure operation of wafer stage WST2 described above, main controller 20 performs wafer exchange between the wafer carrier mechanism (not shown) and wafer stage WST1 at the loading position, and mounts a new wafer W1 on wafer table WTB1. Then, main controller 20 detects the second fiducial mark on fiducial mark plate FM of wafer stage WST1 using alignment system ALG. Incidentally, prior to the detection of the second fiducial mark, main controller 20 executes the reset (re-setting of the origins) of Y interferometer 19 and XZ interferometers 117 and 127 in a state where wafer stage WST1 is located at the loading position. After that, main controller 20 performs the wafer alignment (EGA) using alignment system ALG, which is similar to the one described earlier, to wafer W1, while controlling the position of wafer stage WST1.

Figure 12:
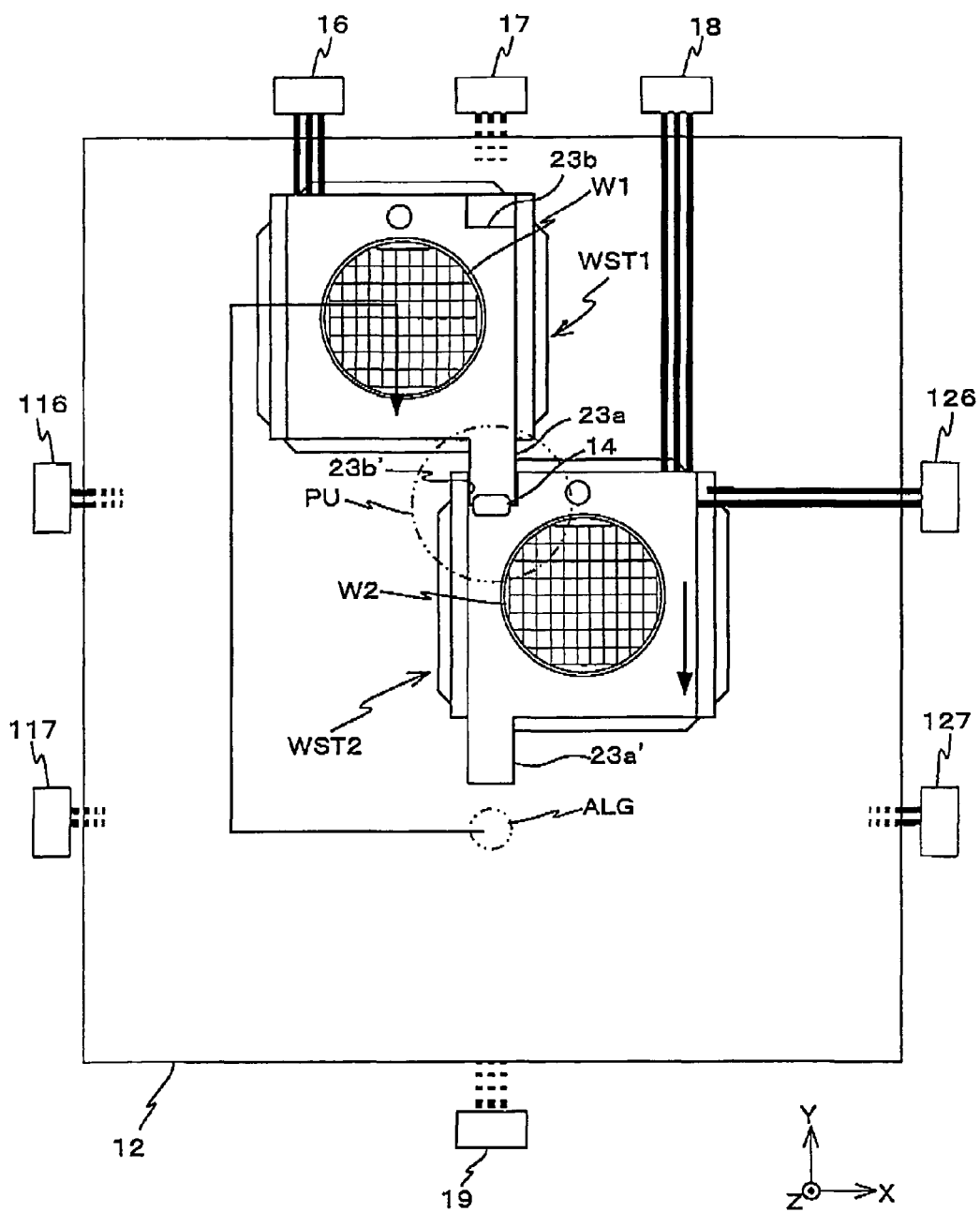
FIG. 12 is a view used to explain a state where a liquid immersion area moves from wafer stage WST2 onto wafer stage WST1, by wafer stages WST1 and WST2 moving while maintaining their scrum state.

When the wafer alignment (EGA) to wafer W1 on wafer table WTB1 has been completed and exposure to wafer W2 on wafer table WTB2 has been also completed, main controller 20 starts the drive of wafer stages WST1 and WST2 toward a second scrum position shown in FIG. 12. At the second scrum position, stepped section 23b' arranged on the +Y side of wafer stage WST2 and overhang section 23a arranged on the −Y side of wafer stage WST1 engage, and both wafer stages WST1 and WST2 come into a scrum state where wafer stages WST1 and WST2 are in proximity or in contact via overhang section 23a and stepped section 23b'. Main controller 20 drives both wafer stages WST1 and WST2 in the −Y direction while keeping this scrum state. According to this operation, liquid immersion area 14 formed between tip lens 191 and wafer table WTB2 sequentially moves onto wafer table WTB2, overhang section 23a, and wafer table WTB1. When the movement of liquid immersion area 14 has been completed, main controller 20 starts exposure to wafer W1 on wafer stage WST1 in the procedure similar to the one described earlier.

Afterwards, main controller 20 repeatedly executes the foregoing parallel operations of wafer stages WST1 and WST2.

As is described in detail above, according to exposure apparatus 100 of the embodiment, by simultaneously driving wafer stage WST1 and wafer stage WST2 in the Y-axis direction while maintaining the scrum state where the wafer stages are in proximity or in contact in the Y-axis direction via overhang section 23a and stepped section 23b' (or overhang section 23a' and stepped section 23b), main controller 20 delivers liquid immersion area 14 formed directly under projection unit PU (projection optical system PL) from one of wafer stage WST1 and wafer stage WST2 to the other of the wafer stages via overhang section 23a or 23a', and makes transition from a first state where one of the wafer stages is located in exposure-time movement area AE to a second state where the other of the wafer stages is located in exposure-time movement area AE.

Therefore, it becomes possible to make the transition from the first state to the second state as described above, or inversely, from the second state to the first state, without the liquid leaking from a gap between both wafer stages WST1 and WST2, in a state of keeping liquid immersion area 14 formed between projection optical system PL (projection unit PU) and the wafer table (or the wafer mounted on the wafer table) located directly below projection optical system PL. With this operation, leakage of the liquid from the gap between both wafer tables WTB1 and WTB2 can effectively be restrained, which makes it possible to effectively restrain adhering of the liquid to reflection surfaces 27b and 27d arranged on the ±Y side surfaces of wafer stages WST1 and WST2. Accordingly, high stability of position measurement of the wafer tables using Y interferometers 16, 17, 18 and 19 is secured.

Further, a process becomes unnecessary in which all of liquid Lq that forms liquid immersion area 14 is recovered and re-supplied during a period after exposure of a wafer via projection optical system PL and liquid immersion area 14 was performed on one of the wafer stages until exposure of a wafer via projection optical system PL and liquid immersion area 14 is started on the other of the wafer stages. Accordingly, the throughput can be improved by shortening the time from completion of exposure on one of the wafer stages to start of exposure on the other of the wafer stages, to the level similar to the case of an exposure apparatus by a non-liquid immersion method. Further, since the liquid constantly exists on the image plane side of projection optical system PL, water stains (water marks) can be effectively prevented from occurring on an optical member (e.g. tip lens 191) on the image plane side of projection optical system PL, and therefore the image-forming performance of projection optical system PL can be favorably maintained for over a long period of time.

Further, according to the embodiment, in the scrum state, wafer stage WST1 and wafer stage WST2 are made to be in proximity or in contact in the Y-axis direction via overhang section 23*a* and stepped section 23*b*' (or overhang section 23*a*' and stepped section 23*b*), in a state of making the surfaces, on which reflection surfaces 27*e* and 27*f* are not arranged, face each other. Therefore, the movement distance (movement stroke) of both wafer stages WST1 and WST2 needed when making the wafer stages move into the scrum state can be shortened, compared with the case where wafer stages WST1 and WST2 are made to be in proximity or in contact in the X-axis direction. In addition, by making both wafer stages WST1 and WST2 be in proximity or in contact in the Y-axis direction in a state where the wafer stages are shifted in the X-axis direction, the movement stroke of both wafer stages WST1 and WST2 can be further shortened. Accordingly, also from this point, the throughput can be improved. Further, there is no possibility that reflection mirrors 27*e* and 27*f* arranged on both sides of wafer stages WST1 and WST2 in the X-axis direction come into contact with each other. Furthermore, there is no possibility to wet the reflection surfaces of reflection mirrors 27*e* and 27*f* with liquid Lq of liquid immersion area 14. Accordingly, main controller 20 can measure the Z-position and rotation in the θy direction of wafer stages WST1 and WST2 via reflection mirrors 27*e* and 27*f* with high precision for over a long period of time.

Further, with the parallel operations of two wafer stages WST1 and WST2 described earlier, the throughput can be improved, compared with a conventional exposure apparatus equipped with a single wafer stage that sequentially performs wafer exchange, wafer alignment, and an exposure operation using only one wafer stage.

Further, a pattern of reticle R can be transferred onto a wafer with high precision by performing exposure with a high resolution and a depth of focus longer than in the air with the liquid immersion exposure, and for example, transfer of a fine pattern of around 70 to 100 nm as a device rule can be realized.

Incidentally, movement routes of both wafer stages WST1 and WST2 on the scrum as shown in the drawings such as FIG. 4 and FIG. 10 are determined so as to correspond to the attachment positions of overhang section 23*a* (or 23*a*') and stepped section 23*b*' (or 23*b*) (or a pair of protruding sections 23*c* and 23*d*) on the respective wafer stages. Accordingly, in the case where the movement routes of both wafer stages WST1 and WST2 on the scrum are different, the installation locations of the overhang section and the stepped section (or a pair of the protruding sections) can appropriately be set in accordance with such movement routes.

Figure 13:
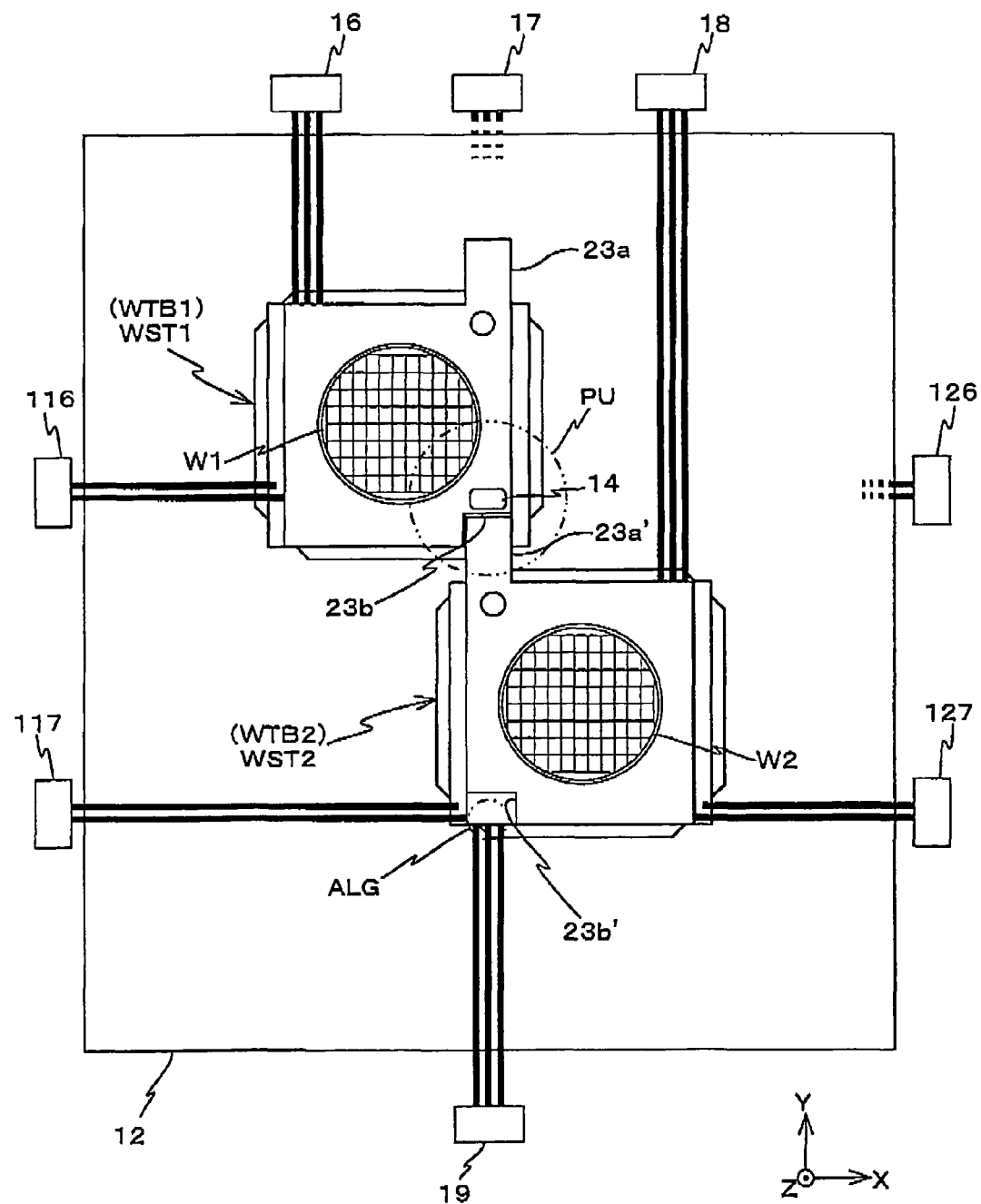
FIG. 13 is a view (No. 1) used to explain an exposure apparatus related to a modified example.
Figure 14:
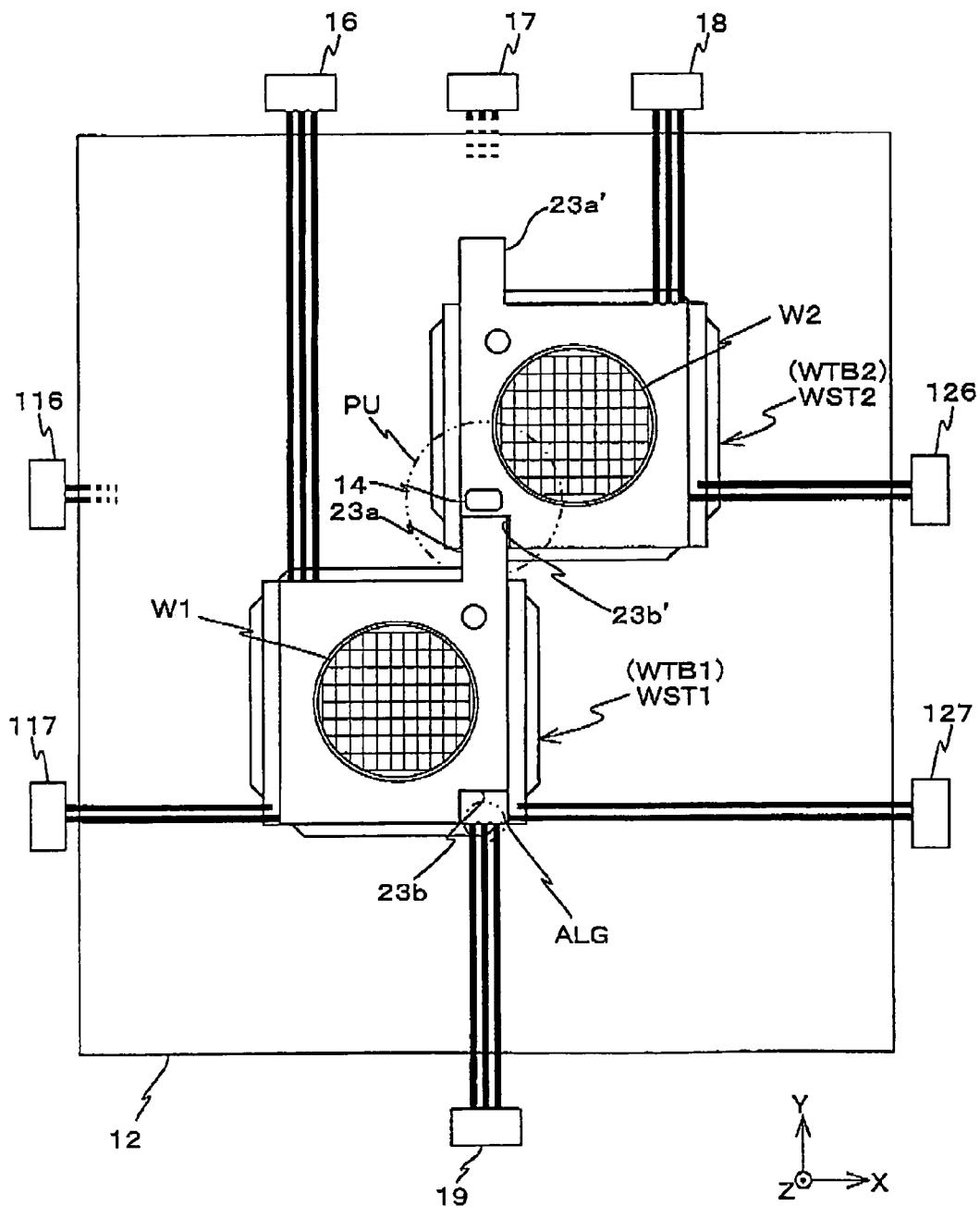
FIG. 14 is a view (No. 2) used to explain an exposure apparatus related to the modified example.

FIGS. 13 and 14 show an exposure apparatus related to a modified example in which overhang section 23*a* is arranged protruding at the +X side end of the +Y side surface of wafer table WTB1 constituting wafer stage WST1 and overhang section 23*a*' is arranged protruding at the −X side end of the +Y side surface of wafer table WTB2 constituting wafer stage WST2. In the exposure apparatus related to this modified example, as shown in FIGS. 13 and 14, on the −Y side of water stage WST1 (wafer table WTB1), stepped section 23*b* is formed at the +X side end and a fiducial mark plate FM1 is placed close to overhang section 23*a*. And, on the −Y side of wafer stage WST2 (wafer table WTB2), stepped section 23*b*' is formed at the −X side end and a fiducial mark plate FM2 is placed close to overhang section 23*a*'. The configuration of other sections and the like are similar to those of the embodiment described earlier. In this case, although fiducial mark plates FM1 and FM2 are similar to fiducial mark plate FM described previously, they are referred to as fiducial mark plates FM1 and FM2 for identification.

In the exposure apparatus related to this modified example, so-called complete alternate scan is employed, and with respect to wafer W1 on wafer stage WST1, exposure is started from a shot area at a right upper position (an end on the +X side and the +Y side) located close to fiducial mark plate FM1, and a shot area located at a right lower position (an end on the +X side and the −Y side) is exposed last, and also with respect to wafer W2 on wafer stage WST2, exposure is started from a shot area at a left upper position (an end on the −X side and the +Y side) located close to fiducial mark plate FM2, and a shot area located at a left lower position (an end on the −X side and the −Y side) is exposed last. FIG. 13 shows a scrum state of both wafer stages WST1 and WST2 where overhang section 23*a*' is engaged with stepped section 23*b* in a contact or proximity state after exposure to wafer W1 has been completed. And, FIG. 14 shows a scrum state of both wafer stages WST1 and WST2 where overhang section 23*a* is engaged with stepped section 23*b*' in a contact or proximity state after exposure to wafer W2 has been completed.

In the exposure apparatus of this modified example, when exposure to wafer W1 has been completed, main controller 20 drives both wafer stages WST1 and WST2 in the +Y direction from the state as shown in FIG. 13, while maintaining the scrum state where overhang section 23*a*' and stepped section 23*b* are made to be proximity or in contact, and delivers liquid immersion area 14 from wafer stage WST1 onto wafer stage WST2. Immediately after delivering liquid immersion area 14, main controller 20 starts movement of wafer stage WST1 toward the loading position, and at the same time, drives wafer stage WST2 to set the position of fiducial mark plate FM2 directly under projection optical system PL, and then, after performing reticle alignment, main controller 20 starts exposure to wafer W2 from a shot area located close to fiducial mark plate FM2.

Meanwhile, when exposure of wafer W2 has been completed, main controller 20 drives both wafer stages WST1 and WST2 in the +Y direction from the state as shown in FIG. 14 while maintaining the scrum state of making overhang section 23*a* and stepped section 23*b*' be in proximity or in contact, in the similar manner to the manner described above, and delivers liquid immersion area 14 from on wafer stage WST2 onto wafer stage WST1. Immediately after delivering liquid immersion area 14, main controller 20 starts movement of wafer stage WST2 toward a second loading position, and at the same time, drives wafer stage WST1 to set the position of fiducial mark plate FM1 directly under projection optical system PL, and then, after performing reticle alignment, main controller 20 starts exposure to wafer W1 from a shot area located close to fiducial mark plate FM1.

As can be seen from the description above, in this modified example, placement of overhang sections 23*a* and 23*a*' and stepped sections 23*b* and 23*b*' is determined, in other words, the offset amount on the scrum of wafer stages WST1 and WST2 is determined, so that after exposure of a wafer on one of the wafer stages has been completed, exposure of a wafer subject to next exposure mounted on the other of the wafer stages can be most efficiently started including detection of the fiducial marks on the fiducial mark plates, or more specifically, so that the movement route of the other of the wafer stages can be shortest and also the time for required for the movement can be shortest. Further, in this modified example, since an alignment completion position of one of the wafer stages on which the wafer alignment has been completed and the scrum start position of both the wafer stages can be set relatively close to each other, it is possible to make the one of the wafer stages wait near the alignment completion position, which makes it possible to start the scrum immediately after the exposure completion.

In the modified example, however, the even number of rows of shot areas exist on wafers W1 and W2, and therefore, as a result of performing exposure of a plurality of shot areas on wafers W1 and W2 by the complete alternate scan, wafer stages WST1 and WST2 are located at substantially the same positions at the time of starting exposure and at the time of completing the exposure, if the positions in the X-axis direction are focused on. More specifically, if exposure is started from a shot area on the +X side, then the exposure is completed with a shot area on the +X side, and if exposure is started from a shot area on the −X side, then the exposure is completed with a shot area on the −X side.

On the other hand, in the case where the odd number of rows of shot areas exist on wafer W1 and W2 and the complete alternate scan is employed, if exposure is started from a shot area on the +X side, then the exposure is completed with a shot area on the −X side, and if exposure is started from a shot area on the −X side, then the exposure is completed with a shot area on the +X side. In this manner, in the case where exposure order of shot areas on wafers W1 and W2 is different from the exposure order in the modified example described above, which includes the case where there are the odd number of rows of shot areas on wafers W1 and W2, the placement of the delivery section such as the overhang sections can be determined, and further if necessary, placement of the fiducial mark plates on the wafer stages can be determined, so that start of exposure of a wafer subject to next exposure can be most efficiently performed including detection of the fiducial marks on the fiducial mark plates, according to the exposure order. Incidentally, in this specification, the scrum which makes it possible to most efficiently perform the exposure start of a wafer subject to next exposure as described above is also referred to as the most efficient scrum.

Incidentally, in the embodiment and the modified example described above, on the premise that reflection mirrors 27e and 27f are arranged, the Y-direction scrum is employed, in which both wafer stages WST1 and WST2 are made to be partially in contact or in proximity in the Y-axis direction so as to prevent reflection mirror 27f of wafer stage WST1 and reflection mirror 27e of water stage WST2 from coming into contact with each other. However, even when the Y-direction scrum is employed, the case can also be considered where, for example, a part of a mechanical section protrudes beyond other sections, from the side surface of wafer stages WST1 and WST2 in the Y-axis direction to the outside. In such a case, it is desirable to set the size of the delivery section such as the overhang section and the like to a size that keeps such a protruding section from contacting with a part of the other wafer stage.

Incidentally, in the embodiment and the modified example described above, the case has been described where the protruding section such as the fixed overhang section is arranged at wafer stages WST1 and WST2, but the protruding section is not limited to the fixed one, and can be movable. In this case, for example, the protruding section can be substantially in a horizontal state only during the scrum of both wafer stages WST1 and WST2, and other occasions than the scrum, i.e., during the nonuse time, the protruding section can be folded.

Further, in the embodiment and the modified example described above, the width of the overhang section in the X-axis direction is set slightly larger than the liquid immersion area, but the width of the overhang section in the X-axis direction is not limited thereto, and the width can be set further larger.

Further, in the embodiment and the modified example described above, the case has been described where during delivery of the liquid immersion area and the like, two wafer stages WST1 and WST2 are driven in the Y-axis direction while keeping their scrum state, but the direction is not limited thereto, and wafer stages WST1 and WST2 can be driven not only in the Y-axis direction but also in the X-axis direction. With such driving, the time until exposure start with respect to a wafer to be exposed next that is held on a wafer stage to which the liquid immersion area has been delivered after the scrum can be shortened even a little, compared with the case where two wafer stages WST1 and WST2 are driven only in the Y-axis direction while maintaining the scrum state.

Incidentally, in the explanation above, the case has been described where a protruding section such as an overhang section is formed on at least one side in the Y-axis direction of at least one of wafer stages WST1 and WST2. However, the scrum state with the positional shift (offset) of both the stages in the X-axis direction, as is described earlier for example, can be employed for two wafer stages at which a protruding section such as an overhang section does not exist. In this case, the offset amount on the scrum can also be set so that the most efficient scrum is realized, similar to the modified example described above. Or, for example, if there is a component (hereinafter, referred to as a protruding object), which protrudes beyond other sections, arranged close to the +X end on the +Y side surface of one wafer stage, wafer stages WST1, and a recessed section that is capable of housing the component inside is formed close to the −X end on the −Y side surface of the other wafer stage, wafer stage WST2, then the offset amount on the scrum can be determined so that the protruding object and the recessed section face. In such a case, it is possible to make the liquid immersion area come and go between on wafer stages WST1 and WST2, while preventing the protruding object from coming into contact with wafer stage WST2 and being damaged. In this case, in the scrum state of both wafer stages WST1 and WST2, the width in the X-axis direction of the contacting or proximity section (a facing section) is set, for example, wider than the width of liquid immersion area 14 in the X-axis direction, i.e., to at least around 100 mm (e.g. 80 mm to 100 mm).

Further, in the embodiment and the modified example described above, on the premise of the movement route of wafer stages WST1 and WST2 as described previously, wafer stages WST1 and WST2 are independently driven along the XY plane by the planar motor. However, the planar motor does not necessarily have to be used, and a linear motor or the like can be used depending on the movement route.

Further, in the embodiment above, the case has been described where the positions of wafer stages WST1 and WST2 during exposure and alignment are measured with interferometer system 118, but instead of or in addition to interferometer system 118, an encoder system having a configuration in which grating sections (Y scales and X scales) are arranged on a wafer table (a wafer stage) and Y heads and X heads are placed external to the wafer stage so as to face the grating sections, as is described in U.S. Patent Application publication No. 2008/0088843 and the like, or an encoder system having a configuration in which encoder heads are arranged on a wafer stage and a grating section (e.g. two-dimensional grating, or one dimensional grating sections which are two-dimensionally placed) is placed external to the wafer stage so as to face the encoder heads, as is described in U.S. Patent Application publication No. 2006/0227309 and the like, can be employed.

Incidentally, in the embodiment above, while the lower surface of nozzle unit 32 and the lower end surface of the tip optical element of projection optical system PL are substantially flush, but this is not intended to be limiting, and for example, the lower surface of nozzle unit 32 can be placed closer to the image plane of projection optical system PL (i.e. to the wafer) than the outgoing surface of the tip optical element. More specifically, the configuration of local liquid immersion device 8 is not limited to the configuration described above, and configurations can also be used, which are described in, for example, European Patent Application Publication No. 1 420 298, U.S. Patent Application Publication No. 2006/0231206, U.S. Patent Application Publication No. 2005/0280791, U.S. Pat. No. 6,952,253, and the like. Further, as is disclosed in, for example, U.S. Patent Application Publication No. 2005/0248856, the optical path on the object plane side of the tip optical element can also be filled with liquid, in addition to the optical path on the image plane side of the tip optical element. Furthermore, a thin film that is lyophilic and/or has a dissolution preventing function can be formed on the partial surface (including at least a contact surface with liquid) or the entire surface of the tip optical element. Incidentally, quartz has a high affinity for liquid, and also needs no dissolution preventing film, whereas in the case of fluorite, at least a dissolution preventing film is preferably formed.

Incidentally, in the embodiment above, pure water (water) is used as the liquid, however, it is a matter of course that the present invention is not limited thereto. As the liquid, liquid that is chemically stable, having high transmittance to illumination light IL and safe to use, such as a fluorine-containing inert liquid can be used. As the fluorine-containing inert liquid, for example, Fluorinert (the brand name of 3M United States) can be used. The fluorine-containing inert liquid is also excellent from the point of cooling effect. Further, as the liquid, liquid having a higher refractive index to illumination light IL than that of pure water (a refractive index is around 1.44), for example, liquid having a refractive index higher than or equal to 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be given. Alternatively, a liquid obtained by mixing arbitrary two or more of these liquids can be used, or a liquid obtained by adding (mixing) at least one of these liquids to (with) pure water can be used. Alternatively, as the liquid, a liquid obtained by adding (mixing) base or acid such as $H^+$, $Cs^+$, $K^+$, $Cl^-$, $SO_4^{2-}$, or $PO_4^{2-}$ to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protective film (topcoat film), an antireflection film, or the like) coated on the surface of a wafer, is preferable. Further, in the case an $F_2$ laser is used as the light source, fomblin oil can be selected. Further, as the liquid, a liquid having a higher refractive index to illumination light IL than that of pure water, for example, a refractive index of around 1.6 to 1.8 can be used. As the liquid, supercritical fluid can also be used. Further, the tip optical element of projection optical system PL can be formed by quartz (silica), or single-crystal materials of fluoride compound such as calcium fluoride (fluorite), barium fluoride, strontium fluoride, lithium fluoride, and sodium fluoride, or can be formed by materials having a higher refractive index than that of quartz or fluorite (e.g. higher than or equal to 1.6). As the materials having a refractive index higher than or equal to 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No. 2005/059618 can be used.

Further, in the embodiment above, the recovered liquid can also be reused, and in this case, a filter that removes impurities from the recovered liquid is preferably arranged in a liquid recovery device, a recovery pipe or the like.

Further, in the embodiment above, the case has been described where the present invention is applied to a scanning exposure apparatus by a step-and-scan method or the like, but this is not intended to be limiting, and the present invention can also be applied to a static exposure apparatus such as a stepper. Further, the present invention can also be applied to a reduced projection exposure apparatus by a step-and-stitch method that synthesizes a shot area and a shot area, an exposure apparatus by a proximity method, a mirror projection aligner, or the like.

Further, the magnification of the projection optical system in the exposure apparatus of the embodiment above is not only a reduction system, but also can be either an equal magnifying system or a magnifying system, and projection optical system PL is not only a dioptric system, but also can be either a catoptric system or a catadioptric system, and in addition, the projected image can be either an inverted image or an upright image. Further, the illumination area and the exposure area described earlier have a rectangular shape, but the shape is not limited to rectangular, and can also be circular arc, trapezoidal, parallelogram or the like.

Incidentally, the light source of the exposure apparatus in the embodiment above is not limited to the ArF excimer laser, but a light source such as a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating device of a YAG laser or the like can also be used. Besides the light sources described above, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, in the embodiment above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, the present invention can also be applied to an exposure apparatus (lithography system) that forms line-and-space patterns on a wafer, for example, by forming interference fringes on the wafer.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, U.S. Pat. No. 6,611,316.

Incidentally, an object on which a pattern is to be formed (an object subject to exposure to which an energy beam is irradiated) in the embodiment above is not limited to a wafer, but can be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for liquid crystal display devices that transfers a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a reticle or a mask used in a light exposure apparatus, an EUV exposure apparatus, an X-ray exposure apparatus, an electron-beam exposure apparatus, and the like.

Incidentally, the above disclosures of all the publications, the pamphlets of the International Publications, and the U.S. Patent Application Publications' specifications, and the U.S. Patents' specifications that are cited in the embodiment above and related to exposure apparatuses and the like are each incorporated herein by reference.

Electron devices such as semiconductor devices are manufactured through the following steps: a step where the function/performance design of a device is performed; a step where a reticle is manufactured based on the design step; a step where a wafer is manufactured using silicon materials; a lithography step where the pattern of the mask (reticle) is transferred onto the wafer with the exposure apparatus (pattern formation apparatus) of the embodiment described earlier and the exposure method thereof; a development step where the exposed wafer is developed; an etching step where an exposed member of an area other than the area where resist remains is removed by etching; a resist removing step where the resist that is no longer necessary when the etching is completed is removed; a device assembly step (including a dicing process, a bonding process, and a packaging process); an inspection step; and the like. In this case, in the lithography step, the exposure method described previously is executed using the exposure apparatus of the embodiment above and a device pattern is formed on the wafer, and therefore, devices with high integration can be manufactured with good productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that exposes an object with an energy beam via an optical system and a liquid, the apparatus comprising:
   a first movable body on which the object can be mounted, and which can move substantially parallel to a predetermined plane within an area of a predetermined range that includes a first area including a liquid immersion area directly under the optical system where the liquid is supplied and a second area located on one side of the first area in a first direction where positional information of the object is acquired;
   a second movable body on which the object can be mounted, and which can move independently from the first movable body, substantially parallel to the predetermined plane within an area including the first area and the second area; and
   a movable body drive system that drives the first and the second movable bodies substantially parallel to the predetermined plane, and during transition from a first state where one of the movable bodies is located in the first area to a second state where the other of the movable bodies is located in the first area, drives the first and the second movable bodies in the first direction in a proximity or contact state where the first movable body and the second movable body are shifted with respect to each other in a second direction that is perpendicular to the first direction within the predetermined plane and the first and the second movable bodies are in proximity to or in contact with each other in the first direction, wherein
   during the transition between the first state and the second state, the movable body drive system maintains the proximity or contact state of the first movable body and the second movable body via a delivery section that is arranged protruding on at least one side in the first direction of at least one of the first and the second movable bodies, in a state where an upper surface of the delivery section is roughly flush with upper surfaces of the first and the second movable bodies, a width in the second direction of the delivery section being wider than that of the liquid immersion area and narrower than that of the upper surface of each of the first and the second movable bodies.

2. The exposure apparatus according to claim 1, wherein
   on the first movable body, a reflection surface inclined with respect to the predetermined plane is arranged on at least one side in the second direction, and
   on the second movable body, a reflection surface inclined with respect to the predetermined plane is arranged on at least one side in the second direction.

3. The exposure apparatus according to claim 1, wherein
   a positional relation between the first movable body and the second movable body in the proximity or contact state is different between a first state transition and a second state transition, in the first state transition the transition being made from the first state where the first movable body is located in the first area to the second state where the second movable body is located in the first area, and in the second state transition the transition being made from the first state where the second movable body is located in the first area to the second state where the first movable body is located in the first area.

4. The exposure apparatus according to claim 3, wherein the object has a plurality of divided areas that are each exposed with the energy beam via the optical system and the liquid, in the first state transition, the positional relation between the first movable body and the second movable body in the proximity or contact state is determined so that exposure of a first divided area on the object mounted on the first movable body can start most efficiently, and in the second state transition, the positional relation between the first movable body and the second movable body in the proximity or contact state is determined so that exposure of a first divided area on the object mounted on the second movable body can start most efficiently.

5. The exposure apparatus according to claim 1, wherein the first movable body moves in an area of a predetermined range between a first position that is a predetermined distance apart from the liquid immersion area to one side and a second position close to the liquid immersion area, in the second direction, and the second movable body moves in an area of a predetermined range between a third position that is a predetermined distance apart from the liquid immersion area to the other side and a fourth position close to the liquid immersion area, in the second direction.

6. The exposure apparatus according to claim 5, wherein in the proximity or contact state, the first movable body makes the delivery section arranged at any one of ends of the first movable body in the first direction on the other side in the second direction be in proximity to or in contact with the second movable body.

7. The exposure apparatus according to claim 5, wherein in the proximity or contact state, the second movable body makes the delivery section arranged at any one of ends of the second movable body in the first direction on the one side in the second direction be in proximity to or in contact with the first movable body.

8. The exposure apparatus according to claim 1, wherein the delivery section is arranged protruding on a part of the first movable body on the other side in the second direction of one side in the first direction, and the delivery section is arranged protruding on a part of the second movable body on one side in the second direction of one side in the first direction.

9. The exposure apparatus according to claim 1, wherein the delivery section is arranged protruding on both sides in the first direction of each of the first and the second movable bodies so that the delivery sections are capable of facing each other in the proximity or contact state.

10. The exposure apparatus according to claim 9, wherein engaged sections that engage with each other and can form an apparently fully-flat surface in an engaged state are formed at respective tips of the two delivery sections that are capable of facing each other.

11. The exposure apparatus according to claim 1, wherein on at least one of the first movable body and the second movable body, a restraint member that restrains leakage of the liquid from a gap between both the movable bodies by being located in the gap, in the proximity or contact state, is arranged.

12. The exposure apparatus according to claim 1, wherein a cable is connected to the first movable body from one side in the second direction, and a cable is connected to the second movable body from the other side in the second direction.

13. The exposure apparatus according to claim 1, further comprising:

a mark detecting system that is placed in the second area and detects a mark existing on a specific movable body that is located directly under the mark detecting system out of the first and the second movable bodies.

14. The exposure apparatus according to claim 1, wherein during the transition, the liquid continues to be held between the optical system and the movable body located in the first area.

15. The exposure apparatus according to claim 1, wherein the movable body drive system includes a planar motor that drives the first and the second movable bodies along the predetermined plane.

16. The exposure apparatus according to claim 1, wherein in the first state transition, the first movable body is located on one side in the first direction of the second movable body, in the proximity or contact state, and in the second state transition, the second movable body is located on one side in the first direction of the first movable body, in the proximity or contact state.

17. The exposure apparatus according to claim 16, wherein in each of the first state transition and the second state transition, a center of the first movable body is located on one side in the second direction with respect to the optical system, and a center of the second movable body is located on the other side in the second direction with respect to the optical system, in the proximity or contact state.

18. The exposure apparatus according to claim 16, wherein in the first state transition and the second state transition, the first movable body and the second movable body in the proximity or contact state are in a same positional relation with respect to the optical system in the second direction.

19. The exposure apparatus according to claim 1, wherein the delivery section is movable, and only during the transition between the first state and the second state, the delivery section is arranged protruding on the at least one side in the first direction of the at least one of the first and the second movable bodies, in a state where the upper surface of the delivery section is roughly flush with the upper surfaces of the first and the second movable bodies.

20. An exposure method of exposing an object with an energy beam via an optical system and a liquid, the method comprising:

driving a first movable body and a second movable body, on each of which the object can be mounted and which can move independently from each other, substantially parallel to a predetermined plane within an area of a predetermined range that includes a first area including a liquid immersion area directly under the optical system where the liquid is supplied and a second area located on one side of the first area in a first direction where positional information of the object is acquired, in the first direction in a proximity or contact state where the first movable body and the second movable body are shifted with respect to each other in a second direction that is perpendicular to the first direction within the predetermined plane and the first and the second movable bodies are in proximity to or in contact with each other in the first direction, to deliver the liquid immersion area from one of the movable bodies to the other of the movable bodies and make transition from a first state where one of the movable bodies is located in the first area to a second state where the other of the movable bodies is located in the first area, wherein during the transition between the first state and the second state, the proximity or contact state of the first movable body and the second movable body is maintained via a delivery section that is arranged protruding on at least one side in the first direction of at least one of the first and the second movable bodies, in a state where an upper surface of the delivery section is roughly flush with upper surfaces of the first and the second movable bodies, a width in the second direction of the delivery section being wider than that of the liquid immersion area and narrower than that of the upper surface of each of the first and the second movable bodies.

21. The exposure method according to claim 20, wherein on the first movable body, a reflection surface inclined with respect to the predetermined plane is arranged on at least one side in the second direction, on the second movable body, a reflection surface inclined with respect to the predetermined plane is arranged on at least one side in the second direction.

22. The exposure method according to claim 20, wherein a positional relation between the first movable body and the second movable body in the proximity or contact state is different between a first state transition and a second state transition, in the first state transition the transition being made from the first state where the first movable body is located in the first area to the second state where the second movable body is located in the first area, and in the second state transition the transition being made from the first state where the second movable body is located in the first area to the second state where the first movable body is located in the first area.

23. The exposure method according to claim 22, wherein in the first state transition, the first movable body is located on one side in the first direction of the second movable body, in the proximity or contact state, and in the second state transition, the second movable body is located on one side in the first direction of the first movable body, in the proximity or contact state.

24. The exposure method according to claim 23, wherein in each of the first state transition and the second state transition, a center of the first movable body is located on one side in the second direction with respect to the optical system, and a center of the second movable body is located on the other side in the second direction with respect to the optical system, in the proximity or contact state.

25. The exposure method according to claim 23, wherein in the first state transition and the second state transition, the first movable body and the second movable body in the proximity or contact state are in a same positional relation with respect to the optical system in the second direction.

26. The exposure method according to claim 22, wherein the object has a plurality of divided areas that are each exposed with the energy beam via the optical system and the liquid, in the first state transition, the positional relation between the first movable body and the second movable body in the proximity or contact state is determined so that exposure of a first divided area on the object mounted on the first movable body can start most efficiently, and in the second state transition, the positional relation between the first movable body and the second movable body in the proximity or contact state is determined so that exposure of a first divided area on the object mounted on the second movable body can start most efficiently.

27. The exposure method according to claim 20, wherein the first movable body moves in an area of a predetermined range between a first position that is a predetermined distance apart from the liquid immersion area to one side and a second position close to the liquid immersion area, in the second direction, and the second movable body moves in an area of a predetermined range between a third position that is a predetermined distance apart from the liquid immersion area to the other side and a fourth position close to the liquid immersion area, in the second direction.

28. The exposure method according to claim 27, wherein in the proximity or contact state, the first movable body makes the delivery section arranged at any one of ends of the first movable body in the first direction on the other side in the second direction be in proximity to or in contact with the second movable body.

29. The exposure method according to claim 28, wherein on at least one of the first movable body and the second movable body, a restraint member that restrains leakage of the liquid from a gap between both the movable bodies by being located in the gap, in the proximity or contact state, is arranged.

30. The exposure method according to claim 27, wherein in the proximity or contact state, the second movable body makes the delivery section arranged at any one of ends of the second movable body in the first direction on the one side in the second direction be in proximity to or in contact with the first movable body.

31. The exposure method according to claim 30, wherein on at least one of the first movable body and the second movable body, a restraint member that restrains leakage of the liquid from a gap between both the movable bodies by being located in the gap, in the proximity or contact state, is arranged.

32. The exposure method according to claim 20, wherein the delivery section is arranged protruding on a part of the first movable body on the other side in the second direction of one side in the first direction, and the delivery section is arranged protruding on a part of the second movable body on one side in the second direction of one side in the first direction.

33. The exposure method according to claim 20, wherein the delivery section is arranged protruding on both sides in the first direction of each of the first and the second movable bodies so that the delivery sections are capable of facing each other in the proximity or contact state.

34. The exposure method according to claim 33, wherein engaged sections that engage with each other and can form an apparently fully-flat surface in an engaged state are formed at respective tips of the two delivery sections that are capable of facing each other.

35. The exposure method according to claim 20, wherein on at least one of the first movable body and the second movable body, a restraint member that restrains leakage of the liquid from a gap between both the movable bodies by being located in the gap, in the proximity or contact state, is arranged.

36. The exposure method according to claim 20, wherein
a cable is connected to the first movable body from one side in the second direction, and
a cable is connected to the second movable body from the other side in the second direction.

37. The exposure method according to claim 20, wherein in the second area, a mark that exists on a specific movable body, which is located directly under a predetermined position out of the first and the second movable bodies, is detected by a mark detecting system.

38. The exposure method according to claim 20, wherein during the transition, the liquid continues to be held between the optical system and the movable body located in the first area.

39. The exposure method according to claim 20, wherein the first and the second movable bodies are driven along the predetermined plane by a planar motor.

40. A device manufacturing method, including
a lithography process in which the object is exposed in the exposure method according to claim 20.

41. An exposure apparatus that exposes an object with an energy beam via a projection optical system and a liquid, the apparatus comprising:
a detection system that is placed in a second area located on one side of a first area in a first direction where the projection optical system is placed, and detects positional information of the object;
a first movable body on which the object can be mounted, and which can move parallel to a predetermined plane in a predetermined area including the first and the second areas;
a second movable body on which the object can be mounted, and which can move parallel to the predetermined plane independently from the first movable body in the predetermined area;
a base member on which the first and the second movable bodies are placed;
a drive system that has a planar motor whose mover is arranged at each of the first and the second movable bodies and whose stator is arranged at the base member, and moves each of the first and the second movable bodies from the first area to the second area and from the second area to the first area by the planar motor; and
a local liquid immersion system that has a liquid immersion member and supplies the liquid to directly under the projection optical system, the liquid immersion member having a lower surface side, to which the object is placed facing, and being arranged on a periphery of a lower end portion of the projection optical system, wherein
to the first movable body, a cable is connected from one end side of the base member,
to the second movable body, another cable is connected from the other end side of the base member, the other end side being opposed to the one end side,
the supplied liquid forms a liquid immersion area directly under the projection optical system,
the drive system moves the first movable body and the second movable body, one of which is placed facing the projection optical system, so that the first and the second movable bodies are made to be in proximity to each other in the first direction and a predetermined positional shift occurs between the first and the second movable bodies in a second direction orthogonal to the first direction within the predetermined plane, from one side of the second direction the cable being connected to the first movable body and from the other side of the second direction the another cable being connected to the second movable body, and replaces the one of the first and the second movable bodies with the other of the movable bodies by moving the first and the second movable bodies in proximity below the projection optical system,
the liquid immersion area is moved from the one of the movable bodies to the other of the movable bodies by the replacement and is maintained directly under the projection optical system in the replacement,
a positional relation between the first movable body and the second movable body during the replacement is different between a first replacement and a second replacement, in the first replacement the first movable body placed facing the projection optical system being replaced with the second movable body, and in the second replacement the second movable body placed facing the projection optical system being replaced with the first movable body, and
during the replacement, the first and the second movable bodies in proximity are moved so that the liquid immersion area passes a position that is closer to either edge in the second direction than a center of an upper surface of each of the first and the second movable bodies while the liquid immersion area is maintained directly under the projection optical system.

42. The exposure apparatus according to claim 41, wherein the first movable body and the second movable body are moved from one of the first and the second areas to the other through different routes respectively.

43. The exposure apparatus according to claim 42, wherein in the movement from one of the first and the second areas to the other, the first movable body passes through a route on the one end side on the base member, and the second movable body passes through a route on the other end side on the base member.

44. The exposure apparatus according to claim 41, wherein each of the first and the second movable bodies passes through different routes between movement from the first area to the second area and movement from the second area to the first area.

45. The exposure apparatus according to claim 41, wherein at least one of the first and the second movable bodies includes a delivery section having an upper surface that is placed facing the projection optical system in the replacement, and
the liquid immersion area is moved from the one of the movable bodies to the other of the movable bodies via the delivery section in the replacement.

46. The exposure apparatus according to claim 45, wherein the delivery section is placed protruding outside from the at least one of the movable bodies, in the replacement.

47. The exposure apparatus according to claim 45, wherein the delivery section is placed so that the upper surface of the delivery section is substantially flush with upper surfaces of the first and the second movable bodies, in the replacement.

48. The exposure apparatus according to claim 41, further comprising:
a measurement system that measures positional information of the first movable body and positional information of the second movable body with an encoder system that has a head arranged at each of the first and the second movable bodies and a grating section placed external to the first and the second movable bodies.

49. A device manufacturing method, including
a lithography process in which a photosensitive object is exposed using the exposure apparatus according to claim 41.

50. The exposure apparatus according to claim 41, wherein
in the first replacement, the first movable body is located on one side in the first direction of the second movable body during the replacement, and
in the second replacement, the second movable body is located on one side in the first direction of the first movable body during the replacement.

51. The exposure apparatus according to claim 50, wherein in each of the first replacement and the second replacement, a center of the first movable body is located on one side in the second direction with respect to the optical system, and a center of the second movable body is located on the other side in the second direction with respect to the optical system, during the replacement.

52. The exposure apparatus according to claim 50, wherein in the first replacement and the second replacement, the first movable body and the second movable body are in a same positional relation with respect to the optical system in the second direction during the replacement.

53. The exposure apparatus according to claim 41, wherein
the object has a plurality of divided areas that are each exposed with the energy beam via the optical system and the liquid,
in the first replacement, the positional relation between the first movable body and the second movable body during the replacement is determined so that exposure of a first divided area on the object mounted on the first movable body can start most efficiently, and
in the second replacement, the positional relation between the first movable body and the second movable body during the replacement is determined so that exposure of a first divided area on the object mounted on the second movable body can start most efficiently.

54. An exposure method of exposing an object with an energy beam via a projection optical system and a liquid, the method comprising:
moving a first movable body and a second movable body independently from each other in a predetermined area within a predetermined plane that includes a first area where the projection optical system is placed and a second area where a detection system that detects positional information of the object is placed and which is located on one side of the first area in a first direction, the first movable body and the second movable body being placed on a base member and the object being mounted on each of the movable bodies;
moving each of the first and the second movable bodies from the first area to the second area and from the second area to the first area within the predetermined plane;
supplying the liquid to directly under the projection optical system by a local liquid immersion system having a liquid immersion member that has a lower surface side, to which the object is placed facing, and is arranged on a periphery of a lower end portion of the projection optical system;
exposing the object with the energy beam via the projection optical system and the liquid;
moving the first and the second movable bodies, one of which is placed facing the projection optical system, so that the first and the second movable bodies are made to be in proximity to each other in the first direction and a predetermined positional shift occurs between the first and the second movable bodies in a second direction orthogonal to the first direction within the predetermined plane; and
replacing the one of the first and the second movable bodies with the other of the movable bodies by moving the first and the second movable bodies in proximity below the projection optical system, wherein
the supplied liquid forms a liquid immersion area directly under the projection optical system,
the liquid immersion area is moved from the one of the movable bodies to the other of the movable bodies by the replacement and is maintained directly under the projection optical system in the replacement,
to the first movable body, a cable is connected from one side of the second direction on one end side of the base member,
to the second movable body, another cable is connected from the other side of the second direction on the other end side of the base member, the other end side being opposed to the one end side,
the first and the second movable bodies are moved by a drive system that has a planar motor whose mover is arranged at each of the first and the second movable bodies and whose stator is arranged at the base member,
a positional relation between the first movable body and the second movable body during the replacement is different between a first replacement and a second replacement, in the first replacement the first movable body placed facing the projection optical system being replaced with the second movable body, and in the second replacement the second movable body placed facing the projection optical system being replaced with the first movable body, and
during the replacement, the first and the second movable bodies in proximity are moved so that the liquid immersion area passes a position that is closer to either edge in the second direction than a center of an upper surface of each of the first and the second movable bodies while the liquid immersion area is maintained directly under the projection optical system.

55. The exposure method according to claim 54, wherein the first movable body and the second movable body are moved from one of the first and the second areas to the other through different routes respectively.

56. The exposure method according to claim 55, wherein in the movement from one of the first and the second areas to the other, the first movable body passes through a route on the one end side on the base member, and the second movable body passes through a route on the other end side on the base member.

57. The exposure method according to claim 54, wherein each of the first and the second movable bodies passes through different routes between movement from the first area to the second area and movement from the second area to the first area.

58. The exposure method according to claim 54, wherein
a delivery section arranged on at least one of the first and the second movable bodies has an upper surface that is placed facing the projection optical system in the replacement, and
the liquid immersion area is moved from the one of the movable bodies to the other of the movable bodies via the delivery section in the replacement.

59. The exposure method according to claim 58, wherein the delivery section is placed protruding outside from the at least one of the movable bodies, in the replacement.

60. The exposure method according to claim 58, wherein the delivery section is placed so that the upper surface of the delivery section is substantially flush with upper surfaces of the first and the second movable bodies, in the replacement.

61. The exposure method according to claim 54, wherein
positional information of the first movable body and positional information of the second movable body are measured with an encoder system that has a head arranged at each of the first and the second movable bodies and a grating section placed external to the first and the second movable bodies.

62. A device manufacturing method, including
a lithography process in which a photosensitive object is exposed using the exposure method according to claim 54.

63. The exposure method according to claim 54, wherein
in the first replacement, the first movable body is located on one side in the first direction of the second movable body during the replacement, and
in the second replacement, the second movable body is located on one side in the first direction of the first movable body during the replacement.

64. The exposure method according to claim 63, wherein
in each of the first replacement and the second replacement, a center of the first movable body is located on one side in the second direction with respect to the optical system, and a center of the second movable body is located on the other side in the second direction with respect to the optical system, during the replacement.

65. The exposure method according to claim 64, wherein
in the first replacement and the second replacement, the first movable body and the second movable body are in a same positional relation with respect to the optical system in the second direction during the replacement.

66. The exposure method according to claim 54, wherein
the object has a plurality of divided areas that are each exposed with the energy beam via the optical system and the liquid,
in the first replacement, the positional relation between the first movable body and the second movable body during the replacement is determined so that exposure of a first divided area on the object mounted on the first movable body can start most efficiently, and
in the second replacement, the positional relation between the first movable body and the second movable body during the replacement is determined so that exposure of a first divided area on the object mounted on the second movable body can start most efficiently.

* * * * *